(12) United States Patent
Kim et al.

(10) Patent No.: US 11,069,879 B2
(45) Date of Patent: Jul. 20, 2021

(54) ORGANIC LIGHT EMITTING DIODE DISPLAY DEVICE WITH MICRO LENSES

(71) Applicant: LG DISPLAY CO., LTD., Seoul (KR)

(72) Inventors: Jintae Kim, Daegu (KR); Sookang Kim, Paju-si (KR); Soyoung Jo, Seoul (KR); Wonhoe Koo, Goyang-si (KR); Jihyang Jang, Goyang-si (KR); Hyunsoo Lim, Goyang-si (KR); Mingeun Choi, Asan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 42 days.

(21) Appl. No.: 16/450,174

(22) Filed: Jun. 24, 2019

(65) Prior Publication Data

US 2019/0312233 A1    Oct. 10, 2019

Related U.S. Application Data

(62) Division of application No. 15/337,517, filed on Oct. 28, 2016, now Pat. No. 10,374,197.

(30) Foreign Application Priority Data

| Oct. 30, 2015 | (KR) | 10-2015-0152637 |
| Jun. 30, 2016 | (KR) | 10-2016-0083121 |
| Oct. 21, 2016 | (KR) | 10-2016-0137889 |

(51) Int. Cl.
*H01L 51/52* (2006.01)
*H01L 27/32* (2006.01)

(52) U.S. Cl.
CPC ...... *H01L 51/5268* (2013.01); *H01L 51/5225* (2013.01); *H01L 51/5271* (2013.01);
(Continued)

(58) Field of Classification Search
CPC ............ H01L 51/5268; H01L 51/5275; H01L 51/5225; H01L 51/5209
(Continued)

(56) References Cited

U.S. PATENT DOCUMENTS

| 7,903,055 B2 * | 3/2011 | Nishikawa .......... H01L 51/5209 257/40 |
| 9,583,739 B2 * | 2/2017 | Hirakata ............. H01L 51/5281 |

(Continued)

FOREIGN PATENT DOCUMENTS

| CN | 104157668 A | 11/2014 |
| CN | 104733501 A | 6/2015 |
| CN | 104952884 A | 9/2015 |

*Primary Examiner* — Robert T Huber
(74) *Attorney, Agent, or Firm* — Dentons US LLP

(57) ABSTRACT

Disclosed is an organic light emitting diode display device. The disclosed organic light emitting diode display device includes an overcoat layer disposed on a substrate that is divided into an emissive area and a non-emissive area, and has multiple micro lenses in the emissive area and at least one depression in the non-emissive area. The organic light emitting diode display device further includes: a first electrode disposed on the overcoat layer, wherein the first electrode is disposed in the entire emissive area and in a part of the non-emissive area; a bank pattern disposed in the non-emissive area so as to be superposed on the depression; an organic light emitting layer disposed on the substrate; and a second electrode disposed on the organic light emitting layer. Accordingly, the organic light emitting diode display device may prevent light leakage.

25 Claims, 17 Drawing Sheets

(52) U.S. Cl.
CPC ...... *H01L 51/5275* (2013.01); *H01L 27/3246* (2013.01); *H01L 51/5209* (2013.01)

(58) Field of Classification Search
USPC .............................. 257/40, E51.021, E33.068
See application file for complete search history.

(56) References Cited

U.S. PATENT DOCUMENTS

| | | | |
|---|---|---|---|
| 9,614,017 B2 | 4/2017 | Li | ........................ H01L 27/3258 |
| 9,716,131 B2 | 7/2017 | Li et al. | |
| 10,374,197 B2* | 8/2019 | Kim | ..................... H01L 51/5225 |
| 2005/0077816 A1* | 4/2005 | Yamada | .............. H01L 51/5228 |
| | | | 313/503 |
| 2008/0169461 A1 | 7/2008 | Park | .................... H01L 27/3246 |
| | | | 257/40 |
| 2014/0332762 A1 | 11/2014 | Kim et al. | |
| 2014/0346449 A1 | 11/2014 | Choi | ................... H01L 27/3211 |
| | | | 257/40 |
| 2016/0181333 A1* | 6/2016 | Park | .................... H01L 27/3246 |
| | | | 257/40 |
| 2016/0359142 A1 | 12/2016 | Huangfu et al. | |

\* cited by examiner

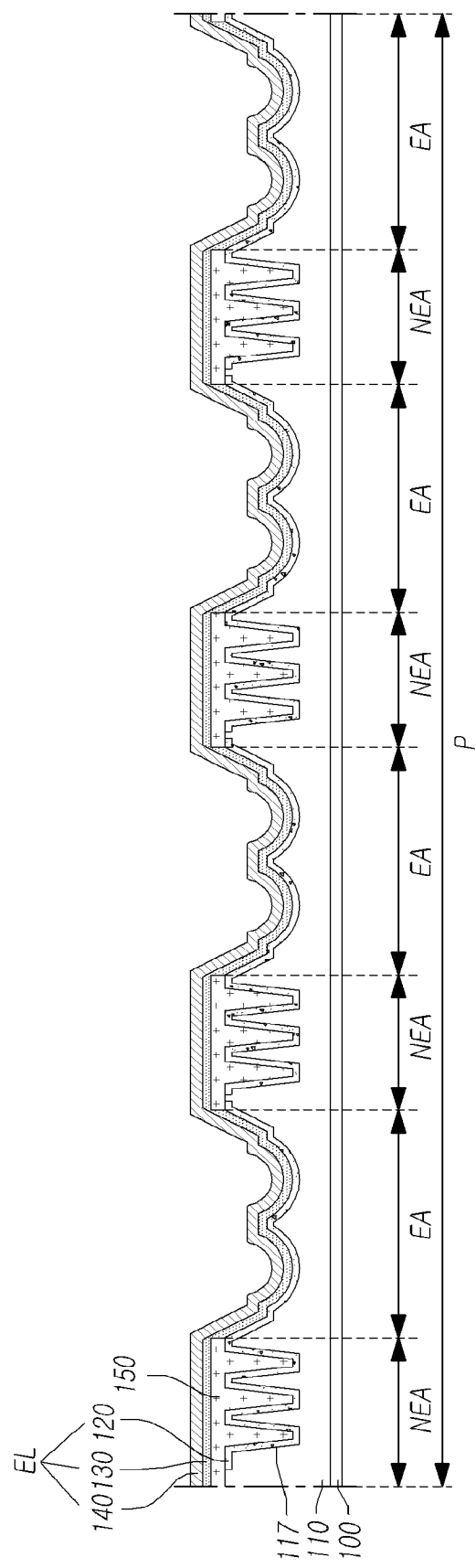

ORGANIC LIGHT EMITTING DIODE DISPLAY DEVICE WITH MICRO LENSES

CROSS REFERENCE TO RELATED APPLICATION

This application is a divisional application of U.S. patent application Ser. No. 15/337,517, filed on Oct. 28, 2016, which claims priority from Korean Patent Application No. 10-2015-0152637, filed on Oct. 30, 2015, Korean Patent Application No. 10-2016-0083121, filed on Jun. 30, 2016, and Korean Patent Application No. 10-2016-0137889, filed on Oct. 21, 2016, all of which are hereby incorporated by reference for all purposes as if fully set forth herein.

BACKGROUND OF THE INVENTION

Field of the Invention

The present invention relates to an organic light emitting diode display device that includes a light-scattering layer having a pattern applied thereto.

Description of the Prior Art

Organic light emitting diode display devices, which are self-light emitting display devices, may be made lighter and slimmer since they do not need separate light sources, as opposed to liquid crystal display devices. Furthermore, organic light emitting diode display devices have been studied as next-generation display devices thanks to their excellent implementation of color, response speed, viewing angle, and contrast ratio (CR), as well as advantages in power consumption by means of low-voltage operation.

Light emitted from an organic light emitting layer of an organic light emitting diode display device passes through multiple components of the organic light emitting diode display device and exits from the organic light emitting diode display device. However, a part of the light emitted from the organic light emitting layer is confined in the organic light emitting diode display device without being extracted therefrom. Accordingly, the light extraction efficiency of an organic light emitting diode display device has come into question.

Particularly, in a bottom-emission type organic light emitting diode display device among organic light emitting diode display devices, light confined in the organic light emitting diode display device due to total-reflection or light-absorption by an anode electrode accounts for as much as about 50% of light emitted from an organic light emitting layer, and light confined in the organic light emitting diode display device due to total-reflection or light-absorption by a substrate accounts for as much as about 30% of the light emitted from the organic light emitting layer. As described above, about 80% of the light emitted from the organic light emitting layer is confined in the organic light emitting diode display device, and only about 20% thereof is extracted from the organic light emitting diode display device, which leads to a very low light-extraction efficiency.

In order to enhance the light extraction efficiency of such an organic light emitting diode display device, a method for attaching a micro lens array (MLA) to the outside of a substrate of an organic light emitting diode display device or a method for forming micro lenses on an overcoat layer of an organic light emitting diode display device has been developed.

However, by applying a micro lens array or micro lenses, light directed toward an adjacent sub-pixel among light emitted from an organic light emitting element travels along an overcoat layer on account of an additional inclined surface generated by the micro lenses disposed on the edge of an emissive area and reaches the adjacent sub-pixel emitting light having a different color to cause a light leakage phenomenon.

SUMMARY OF THE INVENTION

In this background, an aspect of the present invention is to provide an organic light emitting diode display device that includes a light-scattering layer having a pattern applied thereto, which can prevent light leakage and further enhance light extraction efficiency.

An organic light emitting diode display device, according to an embodiment of the present invention, for solving the aforementioned technical problem includes a substrate that is divided into an emissive area and a non-emissive area. Further, the organic light emitting diode display device, according to the embodiment, includes an overcoat layer disposed on the substrate and having multiple micro lenses in the emissive area and at least one depression in the non-emissive area, and each micro lens includes a concave portion and a connecting portion. Furthermore, the organic light emitting diode display device, according to the embodiment, includes a first electrode disposed on the overcoat layer and disposed in the entire emissive area and in a part of the non-emissive area. Moreover, the organic light emitting diode display device, according to the embodiment, includes a bank pattern disposed in the non-emissive area so as to be superposed on the depression. In addition, the organic light emitting diode display device, according to the embodiment, includes an organic light emitting layer disposed on the substrate. Also, the organic light emitting diode display device, according to the embodiment, includes a second electrode disposed on the organic light emitting layer.

An organic light emitting diode display device, according to another embodiment of the present invention, includes a substrate divided into multiple emissive areas and a non-emissive area that surrounds the multiple emissive areas. Further, the organic light emitting diode display device, according to the other embodiment, includes an overcoat layer disposed on the substrate and having multiple micro lenses in each emissive area and at least one depression in the non-emissive area, and each micro lens includes a concave portion and a connecting portion. Furthermore, the organic light emitting diode display device, according to the other embodiment, includes a first electrode disposed on the overcoat layer in the emissive areas. Moreover, the organic light emitting diode display device, according to the other embodiment, includes an organic light emitting layer disposed on the first electrode, the overcoat layer, and the depression. In addition, the organic light emitting diode display device, according to the other embodiment, includes a second electrode disposed on the organic light emitting layer.

In the organic light emitting diode display device, according to the present invention, the overcoat layer in the non-emissive area NEA has the at least one depression, and the bank pattern is provided so as to be superposed on the depression, which makes it possible to prevent light emitted from the organic light emitting element from travelling toward a sub-pixel emitting light having a different color to cause a light leakage phenomenon.

Furthermore, in the organic light emitting diode display device, according to the present invention, the overcoat layer in the non-emissive area NEA has the at least one depression, and a reflective electrode is disposed along the shape of the depression, which makes it possible to absorb light travelling toward a sub-pixel emitting light having a different color, among light emitted from an organic light emitting element, thereby preventing light leakage, or to reflect the light travelling toward the sub-pixel, thereby enhancing light extraction efficiency.

In addition, in the organic light emitting diode display device, according to the present invention, the position of the first electrode disposed on a protruding portion of the overcoat layer is higher than that of the organic light emitting element disposed on the connecting portion of the micro lens, which makes it possible to enhance light extraction efficiency.

BRIEF DESCRIPTION OF THE DRAWINGS

The above and other objects, features, and advantages of the present invention will be more apparent from the following detailed description taken in conjunction with the accompanying drawings, in which:

FIG. 17 is a sectional view of one pixel of an organic light emitting diode display device to which a sub-pixel, according to an embodiment of the present disclosure, is applied.

DETAILED DESCRIPTION OF THE EXEMPLARY EMBODIMENTS

Figure 1:
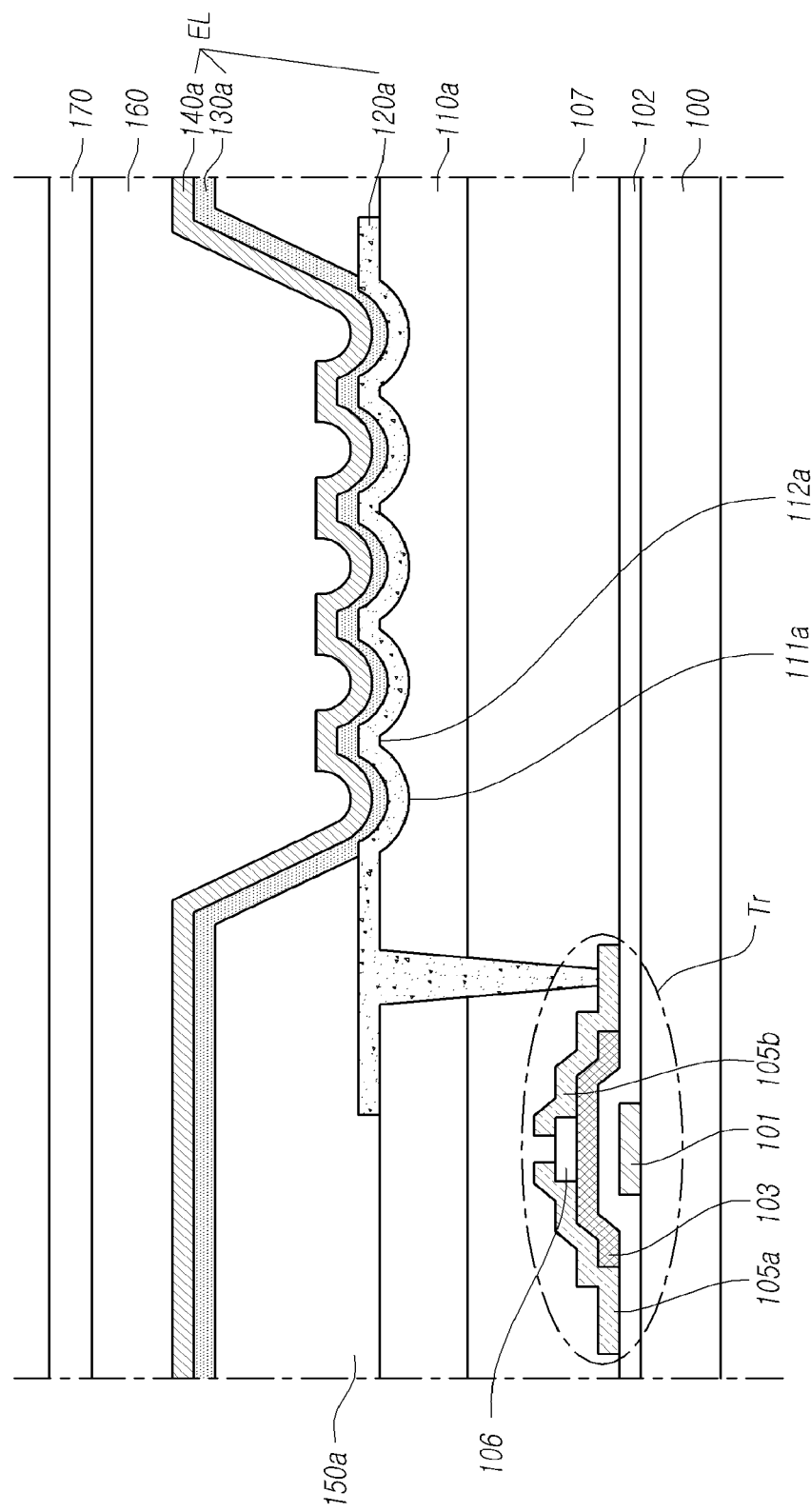
FIG. 1 is a sectional view of an organic light emitting diode display device to which exemplary embodiments of the present disclosure may be applied.

Hereinafter, embodiments of the present invention will be described in detail with reference to the accompanying drawings. The following embodiments are provided, by way of example, so that the idea of the present invention can be sufficiently transferred to those skilled in the art. Therefore, the present invention is not limited to the embodiments as described below, and may be embodied in other forms. Also, in the drawings, the size, thickness, and the like of a device may be exaggeratedly represented for the convenience of description. Throughout the specification, the same reference numerals designate the same elements.

The advantages and features of the present invention and methods of achieving the same will be apparent by referring to embodiments of the present invention as described below in detail in conjunction with the accompanying drawings. However, the present invention is not limited to the embodiments set forth below, but may be implemented in various different forms. The following embodiments are provided only to completely disclose the present invention and inform those skilled in the art of the scope of the present invention, and the present invention is defined only by the scope of the appended claims. Throughout the specification, the same or like reference numerals designate the same or like elements. In the drawings, the dimensions and relative sizes of layers and regions may be exaggerated for the convenience of description.

When an element or layer is referred to as being "above" or "on" another element, it can be "directly above" or "directly on" the other element or layer, or intervening elements or layers may be present. In contrast, when an element is referred to as being "directly on" or "directly above" another element or layer, there are no intervening elements or layers present.

Spatially relative terms, such as "below", "beneath", "lower", "above", "upper" and the like, may be used herein for ease of description to describe one element or feature's relationship to another element(s) or feature(s) as illustrated in the figures. It will be understood that the spatially relative terms are intended to encompass different orientations of the element in use or operation in addition to the orientation depicted in the figures. For example, if the element in the figures is turned over, elements described as "below" or "beneath" other elements would then be oriented "above" the other elements. Thus, the exemplary term "below" can encompass both an orientation of above and below.

Additionally, in describing the components of the present invention, there may be terms used like first, second, A, B, (a), and (b). These are solely for the purpose of differentiating one component from the other but not to imply or suggest the substances, order, sequence, or number of the components.

FIG. 1 is a sectional view of an organic light emitting diode display device to which embodiments of the present invention may be applied. Referring to FIG. 1, the organic light emitting diode display device, to which the embodiments of the present invention are applied, includes a thin film transistor Tr and an organic light emitting element EL electrically connected with the thin film transistor Tr.

Specifically, a gate electrode 101 of the thin film transistor Tr and a gate insulation film 102 are disposed on a first substrate 100. An active layer 103 is provided on the gate insulation film 102 so as to be superposed on the gate electrode 101. An etch-stop layer 106 for protecting a channel area of the active layer 103 is disposed on the active layer 103.

Further, a source electrode 105a and a drain electrode 105b that make contact with the active layer 103 are disposed on the active layer 103. A protective layer 107 is disposed on the source electrode 105a and the drain electrode 105b. The organic light emitting diode display device, to which the embodiments of the present invention may be applied, is not limited to that illustrated in FIG. 1, and may further include a buffer layer disposed between the first substrate 100 and the active layer 103.

Moreover, an overcoat layer 110a is disposed on the protective layer 107. The organic light emitting element EL that includes a first electrode 120a, an organic light emitting layer 130a, and a second electrode 140a is disposed on the overcoat layer 110a. Herein, one of the first electrode 120a and the second electrode 140a may be a reflective layer formed of a metal having a high reflectivity. Meanwhile, a surface plasmon component generated at the boundary between the metal and the organic layer and an optical guided-mode constituted by the organic light emitting layer 130a inserted between the opposite reflective layers account for about 60% to 70% of emitted light. Since a phenomenon may arise in which light is confined in the organic light emitting layer 130a without being emitted, it is necessary to extract light generated by the organic light emitting layer 130a from the display device.

To this end, the overcoat layer 110a of the organic light emitting diode display device, according to embodiments of the present invention, includes: multiple concave portions 111a; and multiple connecting portions 112a, each of which connects the concave portions 111a adjacent to each other. The multiple concave portions 111a may have, but are not limited to, a hemispherical or semielliptical shape.

The multiple concave portions 111a and the connecting portions 112a connecting the adjacent concave portions 111a may be disposed to correspond to the emissive area of each sub-pixel. Herein, the emissive area refers to an area where the organic light emitting layer 130a emits light by means of the first electrode 120a and the second electrode 140a.

Since the multiple concave portions 111a and the connecting portions 112a connecting the adjacent concave portions 111a are disposed to correspond to the emissive area of each sub-pixel, light emitted from the organic light emitting element EL may be further extracted from the display device.

The first electrode 120a of the organic light emitting element EL, which is connected with the drain electrode 105b of the thin film transistor Tr, is disposed on the overcoat layer 110a. Furthermore, although not illustrated in the drawing, a reflective layer may be additionally disposed below the first electrode 120a.

Further, a bank pattern 150a is disposed on the overcoat layer 110a to expose a part of the upper surface of the first electrode 120a. The organic light emitting layer 130a is disposed on the upper surface of the first electrode 120a that is exposed by the bank pattern 150a and on the bank pattern 150a.

Herein, the organic light emitting layer 130a may be disposed only on the upper surface of the first electrode 120a that is exposed by the bank pattern 150a, or may be disposed both on the first electrode 120a and on the bank pattern 150a. Further, the second electrode 140a of the organic light emitting element EL is provided so as to be superposed on the organic light emitting layer 130a and the bank pattern 150a.

Moreover, an encapsulation layer 160 is disposed on the second electrode 140a to protect the organic light emitting element EL from moisture and oxygen. While the encapsulation layer 160 is illustrated in FIG. 1 as having a single layer, the embodiments of the present invention is not limited thereto, and the encapsulation layer 160 may have multiple layers. A second substrate 170 may be disposed on the encapsulation layer 160.

In addition, although not illustrated in the drawing, a polarizing plate may be disposed on the upper surface of the second substrate 170. The polarizing plate may be a polarizing plate having a polarization axis directed in a predetermined direction, and may only transmit light having the same optical axis as the polarization axis among light incident to the upper surface of the second substrate 170. While the polarizing plate has been described as being disposed on the upper surface of the second substrate 170, the present invention is not limited thereto, and the polarizing plate may be disposed on the rear surface of the first substrate 100.

The polarizing plate may be constituted by a single layer or multiple layers. While the polarizing plate has been described as having a polarization axis directed in a predetermined direction, the embodiments of the present invention are not limited thereto, and the polarizing plate may further include a phase retardation film.

Furthermore, although the description of FIG. 1 is focused on the top-emission type organic light emitting diode display device, the embodiments of the present invention may also be applied to a bottom- or dual-emission type organic light emitting diode display device according to necessity.

In a case where the embodiments of the present invention are applied to a bottom-emission type organic light emitting diode display device, a color filter layer may be disposed on the protective layer 107. In this case, the color filter layer may be disposed on each of multiple sub-pixels, or may be disposed only on some of the multiple pixels.

Meanwhile, the color filter layer may be disposed to correspond to the emissive area of each sub-pixel. Herein, the emissive area refers to an area where the organic light emitting layer 130a emits light by means of the first electrode 120a and the second electrode 140a, and when the color filter layer is formed to correspond to the emissive area, that means that the color filter is disposed to prevent blurring and a ghost image problem caused by the mixture of light emitted from adjacent emissive areas.

In order to enhance the light extraction efficiency of the organic light emitting diode display device mentioned above, the overcoat layer 110a may be employed that has micro lenses formed thereon, which are constituted by the concave portions 111a and the connecting portions 112a connecting the adjacent concave portions 111a.

In this case, among light incident to the interface between the micro lenses and the first electrode 120a of the organic light emitting element, light having an incidence angle smaller than or equal to a total-reflection critical angle is reflected by the reflective layer and extracted from the second substrate 170 as it is. In contrast, light having an incidence angle larger than or equal to the total-reflection critical angle collides with the micro lenses to change its optical path, finally escaping from the second substrate 170 with a light travel angle smaller than the total-reflection critical angle without being confined in the organic light emitting element EL.

Meanwhile, each pixel of the present invention includes one or more sub-pixels. For example, one pixel may include two to four sub-pixels.

The sub-pixel refers to a unit by which a particular type of color filter layer is formed, or a unit by which the organic light emitting element may emit light having a particular color without the formation of a color filter layer. While the color defined by the sub-pixel may include red (R), green (G), and blue (B) and may selectively include white (W), the present invention is not limited thereto.

An electrode connected to a thin film transistor that controls light emission of each sub-pixel area of a display panel is referred to as a first electrode, and an electrode disposed on the front of the display panel, or disposed to include two or more pixel areas, is referred to as a second electrode. When the first electrode is an anode electrode, the second electrode is a cathode electrode, and vice versa. Although the following description is made under the assumption that the first electrode is exemplified by an anode electrode and the second electrode is exemplified by a cathode electrode, the present invention is not limited thereto.

Furthermore, a color filter layer having one color may be disposed in the sub-pixel area mentioned above, but the present invention is not limited thereto. In addition, a light-scattering layer may be disposed in each sub-pixel area in order to enhance the light extraction efficiency of the organic light emitting layer. The light-scattering layer mentioned above may be referred to as a micro lens array, a micro lens, a nano pattern, a diffusion pattern, a silica bead, or an out-coupling structure.

While the following description is made assuming that the light-scattering layer is exemplified by a micro lens, the embodiments according to the present invention are not limited thereto, and various types of structures may be coupled to scatter light.

Hereinafter, embodiments of an organic light emitting diode display device of the present invention, which may be applied to the organic light emitting diode display device mentioned above, will be described.

Figure 2:
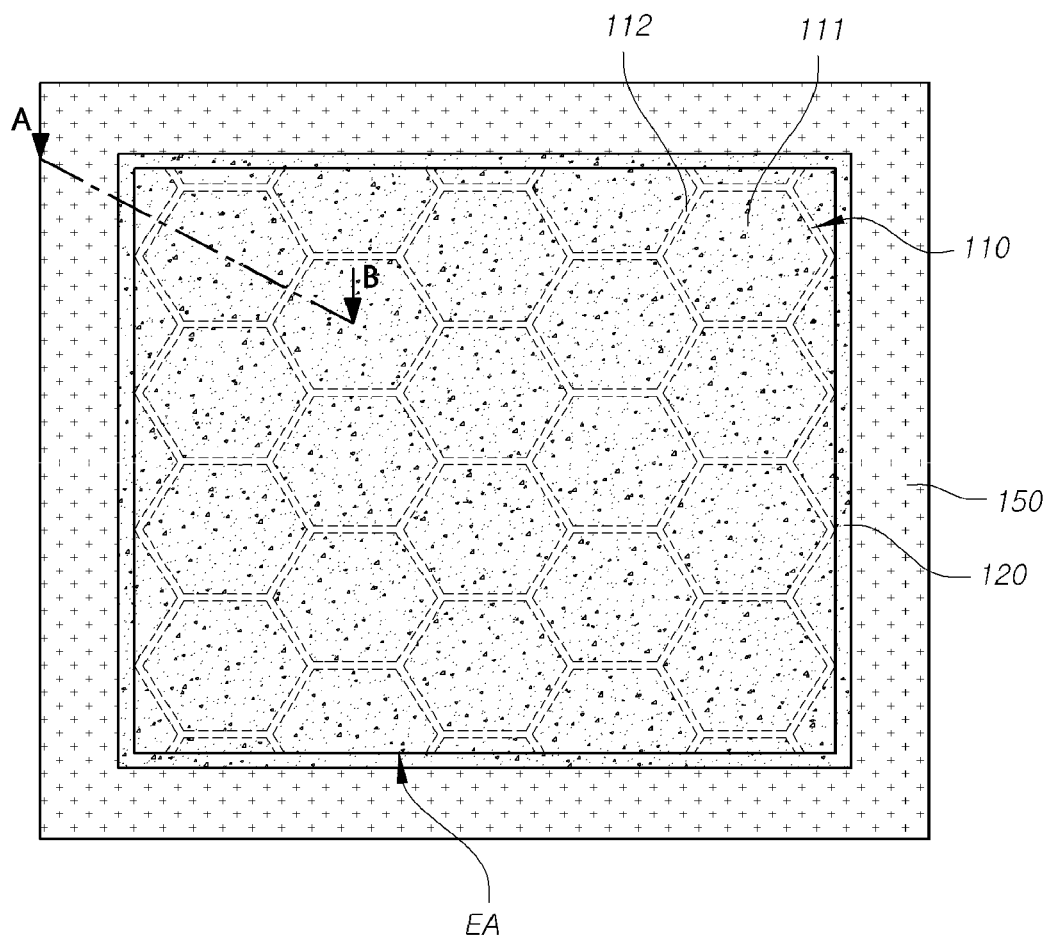
FIG. 2 is a plan view of an organic light emitting diode display device according to a first embodiment of the present disclosure.

FIG. 2 is a plan view of an organic light emitting diode display device according to a first embodiment of the present invention. FIG. 2 illustrates an emissive area EA and a part of a non-emissive area adjacent to the emissive area EA in one sub-pixel. Herein, the emissive area EA may be an emissive area EA that emits light having one color of red (R), green (G), blue (B), and white (W), but is not limited thereto.

Meanwhile, in the organic light emitting diode display device, according to the first embodiment of the present invention, one pixel may include two to four sub-pixels, and elements to be described with reference to FIG. 2 may be applied to at least one of the sub-pixels that constitute one pixel.

Multiple micro lenses are arranged in the emissive area EA. The multiple micro lenses may enhance external light extraction efficiency. Each of the multiple micro lenses may include a concave portion 111 of an overcoat layer 110 and a connecting portion 112 that connects the concave portion 111 and another concave portion 111 adjacent thereto. Further, an organic light emitting element may be disposed on the overcoat layer 110 having the multiple micro lenses formed thereon.

While the micro lenses are illustrated as having a hexagonal shape on the plane of FIG. 2, the shape of the micro lenses, according to the first embodiment of the present invention, is not limited thereto, and the micro lenses may have a circular or elliptical shape.

A first electrode 120 of the organic light emitting element and a bank pattern 150 superposed on the first electrode 120 are provided in a part of the non-emissive area adjacent to the emissive area EA. Herein, the bank pattern 150 may be provided so as to be superposed on depressions formed in the overcoat layer 110. This configuration will be described below in detail with reference to FIG. 3.

Figure 3:
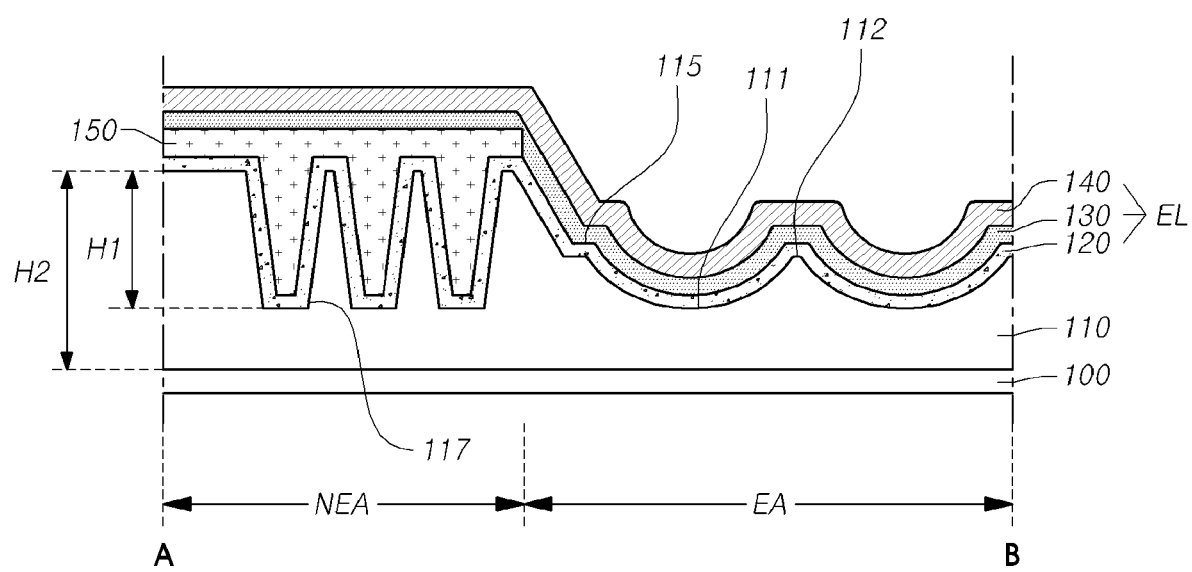
FIG. 3 is a sectional view of the organic light emitting diode display device along line A-B of the organic light emitting diode display device illustrated in FIG. 2.

While the depressions formed in the overcoat layer 110 are illustrated in FIG. 3 as surrounding the emissive area EA on the plane, the organic light emitting diode display device, according to the first embodiment of the present invention, is not limited thereto. For example, the depressions 117 may be disposed on at least one of the upper and lower sides of the emissive area EA on the plane, or may be disposed on at least one of the left and right sides of the emissive area EA on the plane.

Particularly, in the case where the depressions are disposed on at least one of the upper and lower sides of the emissive area EA, substances having low molecular weights may easily escape from a less cured area of the overcoat layer 110 while the overcoat layer 110 is being cured. Specifically, when a semi-cured region is generated in the overcoat layer 110, out-gassing may be induced by substances having low molecular weights, which may cause a defect in the panel. However, since the depressions of the overcoat layer 110 are disposed on at least one side of the emissive area EA in this embodiment, substances having low molecular weights may escape from the overcoat layer 110, thereby preventing a defect in the panel.

FIG. 3 is a sectional view of the organic light emitting diode display device, according to the first embodiment of the present invention, which is taken along line A-B of FIG. 2. Referring to FIG. 3, the organic light emitting diode display device, according to the first embodiment of the present invention, includes a first substrate 100 that is divided into an emissive area EA and a non-emissive area NEA.

The emissive area EA includes multiple micro lenses disposed on the overcoat layer 110, and each of the micro lenses is constituted by a concave portion 111 and a connecting portion 112 that connects the concave portion 111 and another concave portion. Meanwhile, in a case where the organic light emitting diode display device, according to this embodiment, includes a color filter layer disposed below the overcoat layer 110, the color filter layer may be exposed by the multiple micro lenses, or may not be exposed. Herein, when the color filter layer is exposed by the multiple micro lenses, the surface of the color filter layer may have the shape of the multiple micro lenses.

Specifically, the areas of the color filter layer that correspond to the concave portions of the multiple micro lenses provided on the overcoat layer 110 may be exposed. Further, the color filter layer may have multiple concave portions in the areas thereof that correspond to the multiple concave portions of the overcoat layer 110, and may include multiple convex portions together with the concave portions in some cases.

Accordingly, a light extraction effect by means of the micro lenses may not be affected even though the color filter layer is exposed by the multiple micro lenses. Specifically, although the organic light emitting element EL may emit the weakest light from the areas thereof that correspond to the concave portions of the multiple micro lenses of the overcoat layer 110, the exposure of the color filter layer may not have a great effect on the light extraction efficiency by means of the micro lenses since the areas where the color filter layer is exposed correspond to the concave portions of the multiple micro lenses of the overcoat layer 110.

The organic light emitting element EL, which includes the first electrode 120, an organic light emitting layer 130, and a second electrode 140, is disposed on the multiple micro lenses.

Herein, a concave pattern may appear on the surface of the organic light emitting element EL on account of the morphology of the multiple micro lenses, but the present invention is not limited thereto. While the multiple micro lenses are illustrated in FIG. 2 as including the multiple concave portions, the embodiments of the present invention are not limited thereto, and the multiple micro lenses may include multiple convex portions.

Further, at least one step 115 may be formed on the overcoat layer 110 in the non-emissive area NEA or in the emissive area EA adjacent to the non-emissive area NEA. This may help to prevent a short circuit of the first electrode 120 disposed on the overcoat layer 110.

Specifically, the slope of the overcoat layer 110 at the boundary between the emissive area EA and the non-emissive area NEA may vary sharply on account of the multiple micro lenses disposed on the overcoat layer 110 in the emissive area EA, which may cause a short circuit of the first electrode 120.

In this case, since the overcoat layer 110 includes the at least one step 115 at the boundary between the emissive area EA and the non-emissive area NEA, it is possible to reduce the slope of the overcoat layer 110 caused by the micro lenses to prevent the short circuit of the first electrode 120 disposed on the overcoat layer 110.

Furthermore, the non-emissive area NEA includes at least one depression 117 provided on the overcoat layer 110. Specifically, the non-emissive area NEA may include multiple depressions 117 on the overcoat layer 110.

Herein, the height H1 of the depressions 117 may be less than the height H2 of the overcoat layer 110 in the non-emissive area NEA. Meanwhile, in a case where the organic light emitting diode display device, according to this embodiment, includes a color filter layer disposed below the overcoat layer 110, the color filter layer may be exposed by the depressions 117, or may not be exposed.

Namely, the overcoat layer 110 of the organic light emitting diode display device, according to the first embodiment of the present invention, may have the multiple micro lenses formed in the emissive layer EA and the multiple depressions 117 formed in the non-emissive area NEA. The overcoat layer 110 may be obtained through patterning using a mask.

Figure 4:
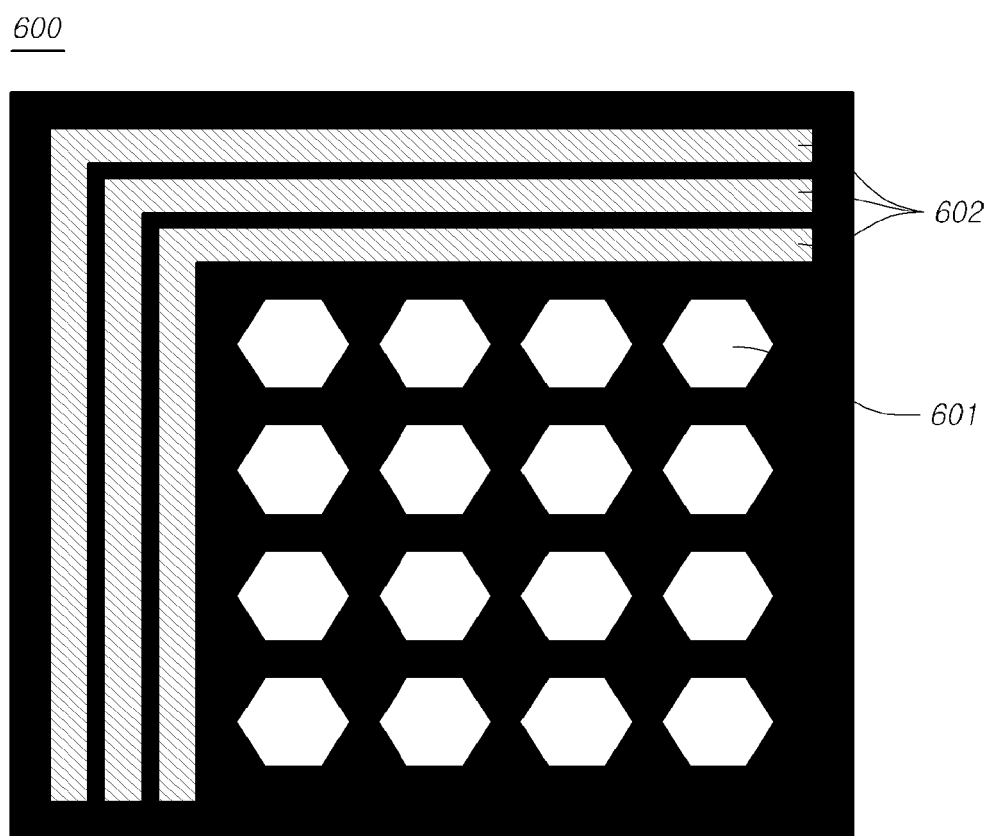
FIG. 4 is a plan view illustrating a part of a mask that is used to form multiple micro lenses and multiple depressions on an overcoat layer of an exemplary organic light emitting diode display device.

A mask necessary for forming the overcoat layer 110 having the aforementioned structure will be described below with reference to FIG. 4. FIG. 4 illustrates a part of a mask that is used to form multiple micro lenses and multiple depressions on an overcoat layer.

Referring to FIG. 4, the overcoat layer of the organic light emitting diode display device, according to the first embodiment of the present invention, may include multiple micro lenses and multiple depressions formed through an exposure process using the mask 600. The mask 600 may have a plurality of first patterns 601 for forming the multiple micro lenses and a plurality of second patterns 602 for forming the multiple depressions.

When the overcoat layer is subjected to exposing, the mask 600 is disposed opposite to the substrate on which the overcoat layer is disposed. In this case, the plurality of first patterns 601 of the mask may be arranged to correspond to the emissive area of the substrate, and the plurality of second patterns 602 may be arranged to correspond to the non-emissive area of the substrate. Meanwhile, the first patterns 601 and the second patterns 602 may transmit or block light according to the material of the overcoat layer.

The first electrode 120 of the organic light emitting element EL disposed in the emissive area EA may extend so as to be disposed on the depressions 117. In this case, the first electrode 120 may be disposed to fill only a part of each depression 117. Further, the bank pattern 150 may be disposed to completely fill the remaining part of the depression 117.

In this case, the bank pattern 150 may define the emissive area EA and the non-emissive area NEA. Further, the organic light emitting layer 130 and the second electrode 140 of the organic light emitting element EL may extend from the emissive area EA so as to be disposed on the bank pattern 150. While the organic light emitting layer 130 is illustrated in FIG. 5 as being disposed on the bank pattern 150, the first embodiment of the present invention is not limited thereto, and the organic light emitting layer 130 may be disposed only on the first electrode 120 that is provided in the emissive area EA.

The bank pattern 150 that fills the at least one depression 117 provided in the non-emissive area NEA may be formed of an opaque organic material. Accordingly, the bank pattern 150 may prevent light emitted from the organic light emitting element EL from reaching a different adjacent sub-pixel and being extracted as a light leakage component.

Such a principle will be described below in detail with reference to FIG. 5. FIG. 5 is a view illustrating the principle by which a light extraction phenomenon and a light leakage phenomenon are restricted in the organic light emitting diode display device according to the first embodiment of the present invention.

Figure 5:
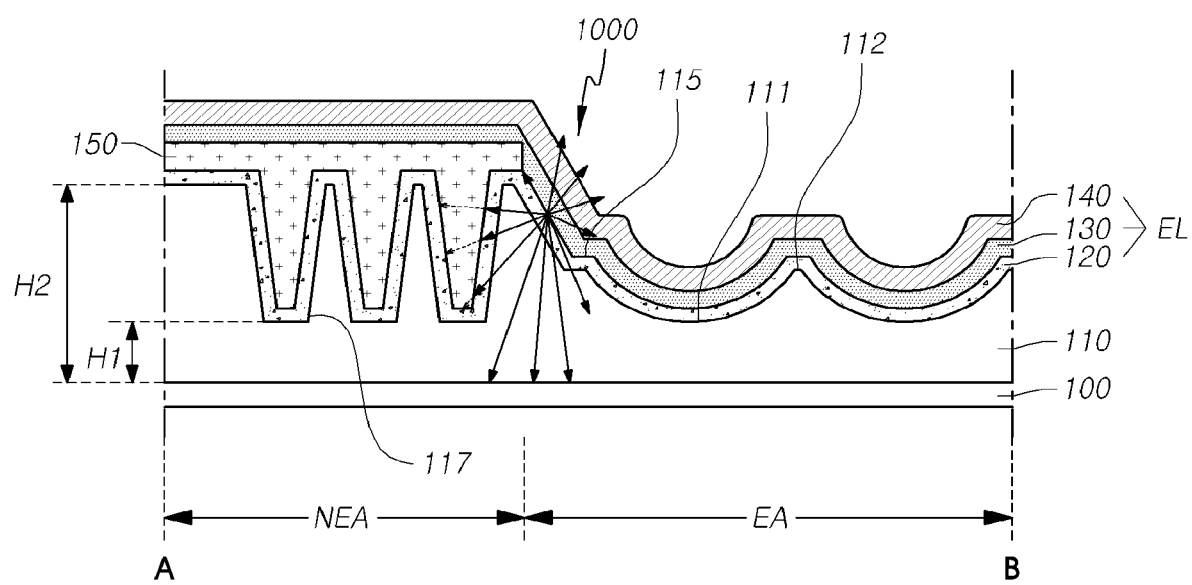
FIG. 5 is a sectional view illustrating the principle by which a light leakage phenomenon is restricted in the organic light emitting diode display device illustrated in FIG. 2.

Referring to FIG. 5, light 1000 emitted from the organic light emitting element EL is output in a 360 degree direction, that is, omnidirectionally. Herein, a part of the light 1000 emitted from the organic light emitting element EL is extracted from the first substrate 100 through the micro lenses.

Specifically, in a case where the organic light emitting diode display device, according to this embodiment, is a bottom-emission type organic light emitting diode display device, the refractive indices of the first electrode 120 and the organic light emitting layer 130 of the organic light emitting element EL may be higher than those of the first substrate 100 and the overcoat layer 110. For example, the first substrate 100 and the overcoat layer 110 may have a refractive index of about 1.5, and the first electrode 120 and the organic light emitting layer 130 of the organic light emitting element EL may have a refractive index of 1.7 to 2.0.

Herein, since the organic light emitting layer 130 has almost the same refractive index as that of the first electrode 120, the optical path of the light 1000 generated from the organic light emitting layer 130 is not varied at the interface between the organic light emitting layer 130 and the first electrode 120. Meanwhile, due to a difference in the refractive index between the first electrode 120 and the overcoat layer 110, the light 1000 having passed through the first electrode 120 may be input with an incidence angle smaller than a total-reflection critical angle, or with an incidence angle larger or equal to the total-reflection critical angle, through the interface between the first electrode 120 and the overcoat layer 110.

In this case, the light that is input with an incidence angle smaller than the total-reflection critical angle through the interface between the first electrode 120 and the overcoat layer 110 may be extracted from the first substrate 100. The light travelling toward the second substrate (not illustrated) of the organic light emitting element EL is reflected by the second electrode 140 to travel toward the first substrate 100 and is extracted from the first substrate 100 by means of the micro lenses. This may help to enhance the light extraction efficiency in the emissive area EA.

Furthermore, in a case where the organic light emitting diode display device, according to this embodiment, is a top-emission type organic light emitting diode display device, a part of light emitted from the organic light emitting element EL is output toward the second substrate (not illustrated). In addition, a part of the light emitted from the organic light emitting element EL is reflected by the first electrode 120 and extracted from the second substrate (not illustrated).

Moreover, light directed toward an adjacent sub-pixel among the light 1000 generated from the organic light emitting element EL may travel along the overcoat layer 110 by means of an additional inclined surface that is generated by the micro lenses formed at the edge of the emissive area EA, and may reach the adjacent sub-pixel emitting light having a different color to cause a light leakage phenomenon. Particularly, in a case where the first electrode 120 is not a reflective electrode, the light leakage phenomenon may be a serious problem.

Meanwhile, in this embodiment, the bank pattern 150 is provided so as to be superposed on the at least one depression 117 formed in the overcoat layer 110 in the non-emissive area NEA. Accordingly, the bank pattern 150 may prevent light directed toward an adjacent sub-pixel, among the light 1000 generated from the organic light emitting element EL, from travelling along the overcoat layer 110 and reaching the sub-pixel emitting light having a different color.

In this case, the bank pattern 150 may be formed of an opaque organic material to absorb the light travelling along the overcoat layer 110. Accordingly, the bank pattern 150 may prevent light from travelling to a different adjacent sub-pixel. Furthermore, since the bank pattern 150 is disposed to completely fill the depressions 117, the bank pattern 150 may absorb all the light that reaches the depressions 117 to prevent the light from travelling to a different adjacent sub-pixel. This may help to restrict light leakage between different sub-pixels.

Figure 6:
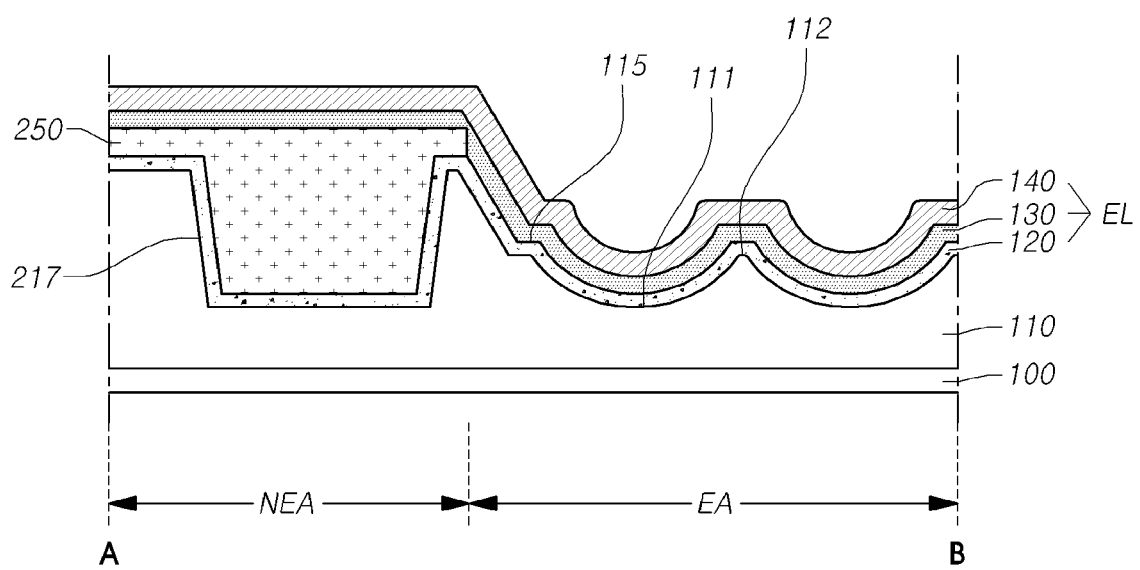
FIG. 6 is a sectional view of an organic light emitting diode display device having another type of depression.

The depression according to the present invention may be formed as illustrated in FIG. 6. FIG. 6 is a sectional view of an organic light emitting diode display device having another type of depression.

The organic light emitting diode display device of FIG. 6 may include the same elements as those of the organic light emitting diode display device in the aforementioned embodiment. Repetitive descriptions identical to ones given in the aforementioned embodiment will be omitted. Also, identical elements are provided with identical reference numerals.

Referring to FIG. 6, the organic light emitting diode display device, according to the present invention, includes one depression 217 provided on an overcoat layer 210 in the non-emissive area NEA of one sub-pixel. In this case, a first electrode 120 of an organic light emitting element EL is disposed to fill a part of the depression 217, and a bank pattern 250 is disposed on the first electrode 120 to fill the remaining part of the depression 217.

Since the bank pattern 250 is disposed deep in the overcoat layer 210 through the depression 217, the hank pattern 250 may absorb light directed toward an adjacent sub-pixel among light emitted from the organic light emitting element EL to prevent the light from travelling to the different sub-pixel.

Figure 7:
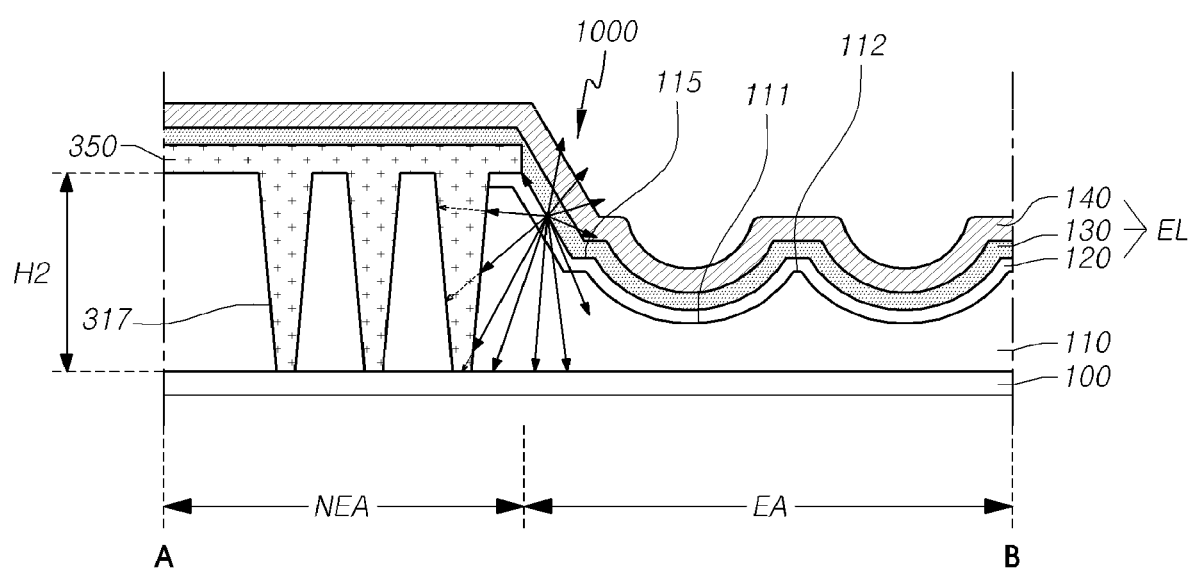
FIG. 7 is a sectional view of an organic light emitting diode display device having yet another type of depression.

Also, the depression according to the present invention may be formed as illustrated in FIG. 7. FIG. 7 is a sectional view of an organic light emitting diode display device having yet another type of depression.

The organic light emitting diode display device of FIG. 7 may include the same elements as those of the organic light emitting diode display devices in the aforementioned embodiments. Repetitive descriptions identical to ones given in the aforementioned embodiments will be omitted. Also, identical elements are provided with identical reference numerals.

Referring to FIG. 7, the organic light emitting diode display device, according to the present invention, includes multiple depressions 317 provided on an overcoat layer 310 in the non-emissive area NEA of one sub-pixel. In this case, the depressions 317 may be disposed to expose a first substrate 100.

Further, a bank pattern 350 may be disposed to completely fill the depressions 317. In this case, the bank pattern 350 may be disposed to overlap a first electrode 120. For example, the bank pattern 350 may be disposed to overlap the first electrode 120 in the non-emissive area NEA other than the depressions 317. That is, the bank pattern 350 may not overlap the first electrode 120 within the depressions 317, but the present invention is not limited thereto.

Since the depressions 317 are located to expose the first substrate 100, and the bank pattern 350 is provided to completely fill the entire depressions 317, the bank pattern 350 may effectively absorb light travelling toward an adjacent sub-pixel among light emitted from the organic light emitting element EL. Specifically, the bank pattern 350 has a vertical length corresponding to the vertical length H2 of the overcoat layer 310 so that the bank pattern 350 may absorb all the light travelling along the overcoat layer 310. Accordingly, the bank pattern 150 may prevent the light from travelling to a different adjacent sub-pixel.

Next, an organic light emitting diode display device, according to a second embodiment of the present invention, will be described below with reference to FIGS. 8 to 10. The organic light emitting diode display device, according to the second embodiment of the present invention, may include the same elements as those of the organic light emitting diode display devices in the aforementioned embodiments. Repetitive descriptions identical to ones given in the aforementioned embodiments will be omitted. Also, identical elements are provided with identical reference numerals.

Figure 8:
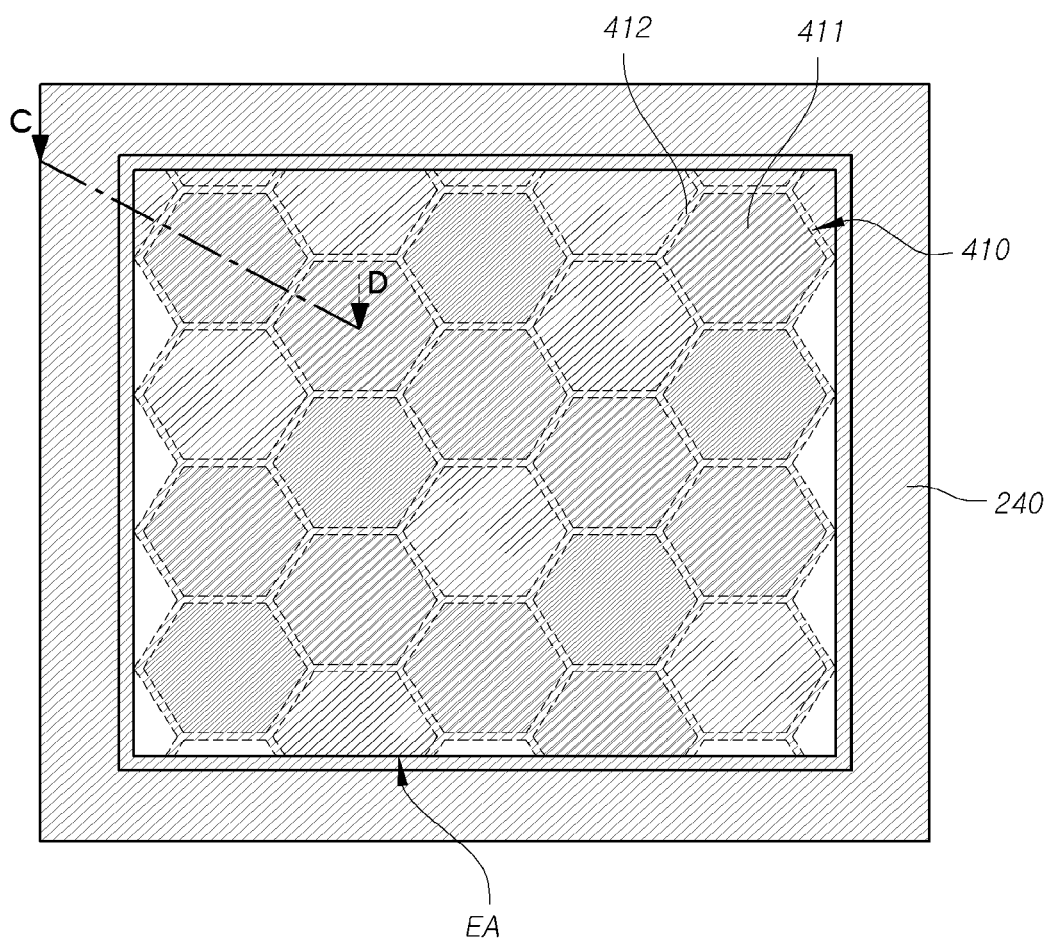
FIG. 8 is a plan view of an organic light emitting diode display device according to a second embodiment of the present disclosure.

FIG. 8 is a plan view of the organic light emitting diode display device according to the second embodiment of the present invention. FIG. 8 illustrates an emissive area (EA) and a part of a non-emissive area adjacent to the emissive area (EA) in one sub-pixel.

Multiple micro lenses are arranged in the emissive area (EA). Each of the multiple micro lenses may include a concave portion 411 of an overcoat layer 410 and a connecting portion 412 that connects the concave portion 411 and another concave portion 411 adjacent thereto. Further, an organic light emitting element may be disposed on the overcoat layer 410 having the multiple micro lenses formed thereon.

A first electrode of the organic light emitting element and a bank pattern superposed on the first electrode are provided in a part of the non-emissive area adjacent to the emissive area EA. Herein, the bank pattern may be provided so as to be superposed on depressions formed in the overcoat layer 410 in the non-emissive area.

In this case, the bank pattern may be disposed to fill only a part of each depression. Further, an organic light emitting layer and a second electrode 240 of the organic light emitting element may be disposed in the sub-pixel that includes the bank pattern. This configuration will be described below in detail with reference to FIG. 9.

Figure 9:
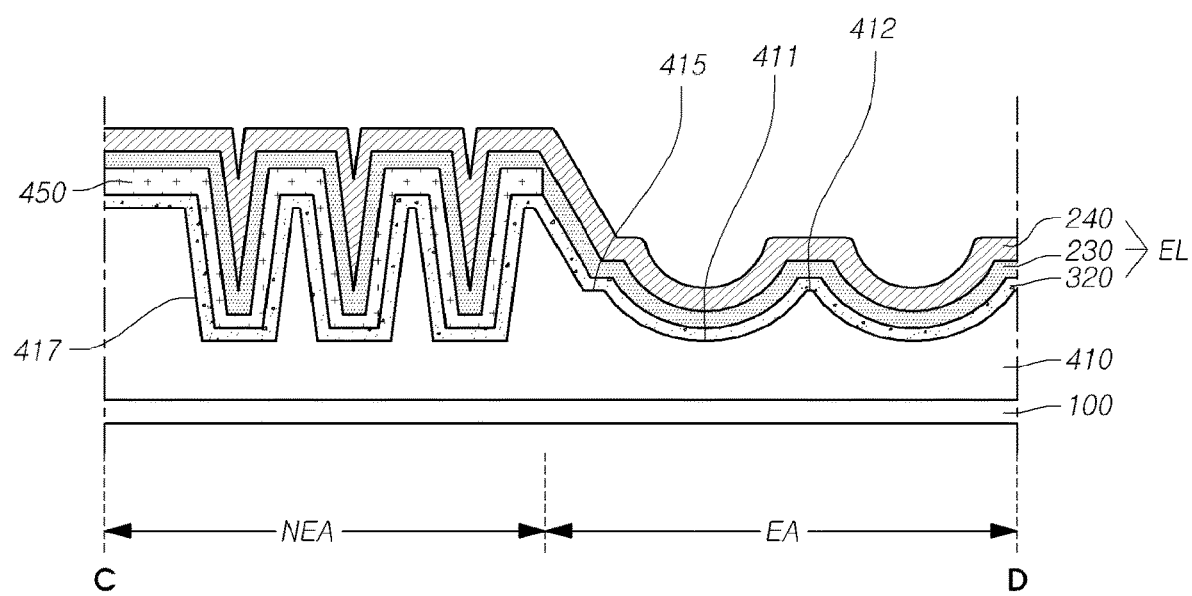
FIG. 9 is a sectional view along line C-D of the organic light emitting diode display device illustrated in FIG. 8.

FIG. 9 is a sectional view of the organic light emitting diode display device, according to the second embodiment of the present invention, which is taken along line C-D of FIG. 8. Referring to FIG. 9, the organic light emitting diode display device, according to the second embodiment of the present invention, includes a first substrate 100 that is divided into an emissive area EA and a non-emissive area NEA.

The emissive area EA includes multiple micro lenses disposed on the overcoat layer 410, and each of the micro lenses is constituted by a concave portion 411 and a connecting portion 412 that connects the concave portion 411 and another concave portion. The organic light emitting element EL that includes the first electrode 320, the organic light emitting layer 230, and the second electrode 240 is disposed on the multiple micro lenses.

Further, at least one step 415 may be formed on the overcoat layer 410 in the non-emissive area NEA or in the emissive area EA adjacent to the non-emissive area NEA. Furthermore, the non-emissive area NEA includes at least one depression 417 provided on the overcoat layer 410.

While multiple depressions 417 are illustrated in FIG. 9 as being disposed on the overcoat layer 410 in the non-emissive area NEA, the second embodiment of the present invention is not limited thereto, and one depression 417 may be disposed on the overcoat layer 410 in the non-emissive area NEA.

The multiple micro lenses are arranged in the emissive area EA, and the first electrode 320 of the organic light emitting element EL is disposed on the overcoat layer 410 having the multiple depressions 417 formed in the non-emissive area NEA. In this case, the first electrode 320 may be formed to have a morphology that corresponds to the surface shapes of the multiple micro lenses and the multiple depressions 417.

Furthermore, the first electrode 320 may be disposed to fill a part of each depression 417. The bank pattern 450 may be disposed to fill a part of the depression 417 in which the first electrode 320 is disposed.

The bank pattern 450 may be formed of a transparent organic material or an opaque organic material. Herein, the bank pattern 450 may define the emissive area EA and the non-emissive area NEA of the sub-pixel and may prevent light leakage between sub-pixels.

The organic light emitting layer 230 and the second electrode 240 are disposed on the first substrate 100 on which the bank pattern 450 is disposed. The second electrode 240 may be a reflective electrode formed of a high-refractive material. Herein, the organic light emitting layer 230 and the second electrode 240 may also have a morphology that corresponds to the multiple micro lenses and the multiple depressions 417.

Meanwhile, the bank pattern 450 and the second electrode 240 of the organic light emitting element EL may prevent light travelling toward an adjacent sub-pixel, among light emitted from the organic light emitting element EL, from travelling to a different adjacent sub-pixel, thereby preventing light leakage. Such a principle will be described below with reference to FIG. 10.

Figure 10:
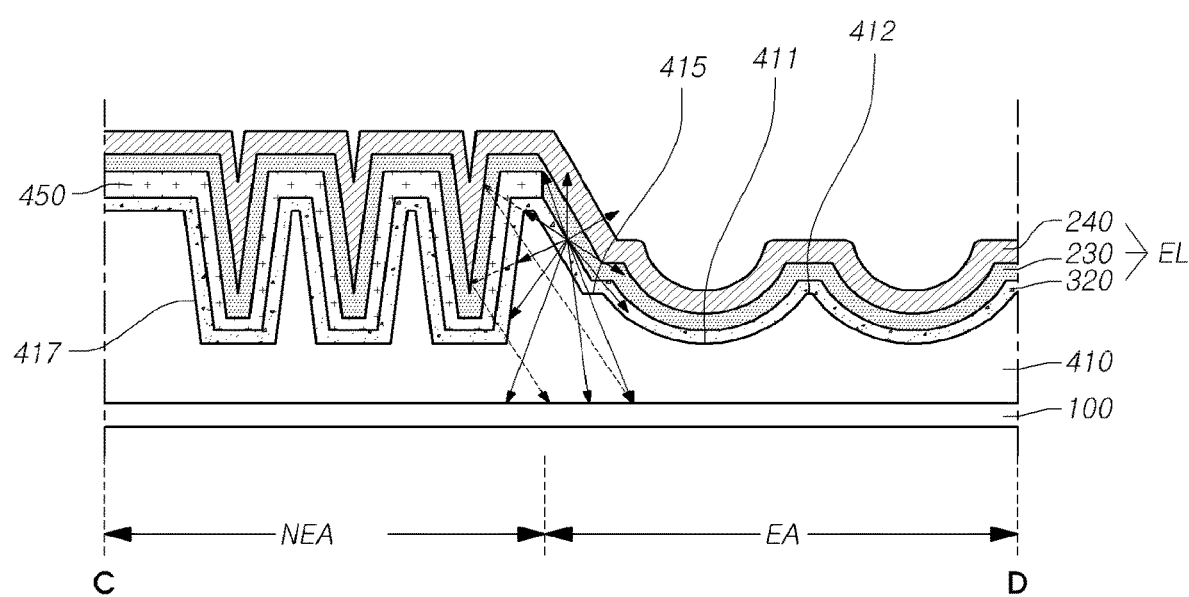
FIG. 10 is a sectional view illustrating the principle by which a light leakage phenomenon is restricted in the organic light emitting diode display device illustrated in FIG. 8.

FIG. 10 is a view illustrating the principle by which a light leakage phenomenon is restricted in the organic light emitting diode display device according to the second embodiment of the present invention. Referring to FIG. 10, in the organic light emitting diode display device, according to the second embodiment of the present invention, light emitted from the organic light emitting element EL is refracted at the interface between the overcoat layer 410 and the first electrode 320 in the non-emissive area NEA due to a difference in the refractive index therebetween and is input to the first electrode 320. The light input to the first electrode 320 may be absorbed into, or transmitted through, the bank pattern 450 disposed on the first electrode 320.

The light having passed through the bank pattern 450 reaches the second electrode 240 via the organic light emitting layer 230 disposed on the bank pattern 450. Herein, the first electrode 320, the bank pattern 450, and the organic light emitting layer 230 may have similar refractive indices so that the light may travel without a change in its optical path.

Meanwhile, the light that reaches the second electrode 240 formed of a reflective material may be absorbed or reflected. Herein, in a case where the light is absorbed by the second electrode 240, it is possible to prevent light directed toward an adjacent sub-pixel, among the light 1100 generated from the organic light emitting element EL, from travelling along the overcoat layer 410 to reach the sub-pixel emitting light having a different color.

Furthermore, in a case where the light is reflected by the second electrode 240, the light may be extracted from the first substrate 100 via the micro lenses arranged in the emissive area EA. As a result, the light extraction efficiency in the emissive area EA may be enhanced.

Next, a third embodiment of the present invention will be described below with reference to FIG. 11. An organic light emitting diode display device, according to this embodiment, may include the same elements as those of the organic light emitting diode display devices in the aforementioned embodiments. Repetitive descriptions identical to ones given in the aforementioned embodiments will be omitted. Also, identical elements are provided with identical reference numerals.

Figure 11:
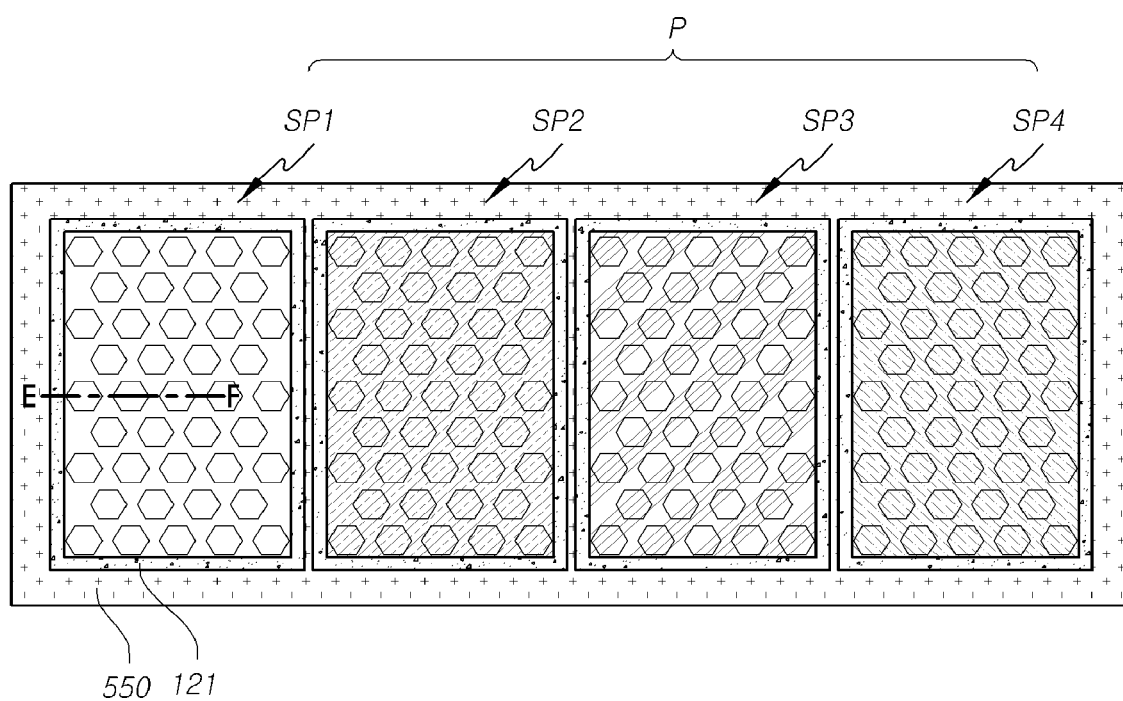
FIG. 11 is a plan view of an organic light emitting diode display device according to a third embodiment of the present disclosure.

FIG. 11 is a plan view of the organic light emitting diode display device according to the third embodiment of the present invention. Referring to FIG. 11, one pixel P may include four sub-pixels SP1, SP2, SP3, and SP4 in the organic light emitting diode display device according to the third embodiment of the present invention. In this case, the sub-pixels may emit light having different colors, respectively.

An emissive area and a non-emissive area may be distinguished from each other by a bank pattern 550 in the organic light emitting diode display device according to the third embodiment. Specifically, the area where the bank pattern 550 is disposed may be defined as the non-emissive area, and the area where the bank pattern 550 is not disposed may be defined as the emissive area.

An organic light emitting element that includes a first electrode 121, an organic light emitting layer (not illustrated), and a second electrode (not illustrated) may be disposed in the emissive area, and the organic light emitting element may extend to a part of the non-emissive area.

Specifically, the first electrode 121, which is one of the elements of the organic light emitting element, may be disposed in the emissive area, and may extend to a part of the non-emissive area adjacent to the emissive area. Further, the organic light emitting layer (not illustrated) and the second electrode (not illustrated) may be disposed in the active area of the organic light emitting diode display panel, but the present invention is not limited thereto.

Figure 12:
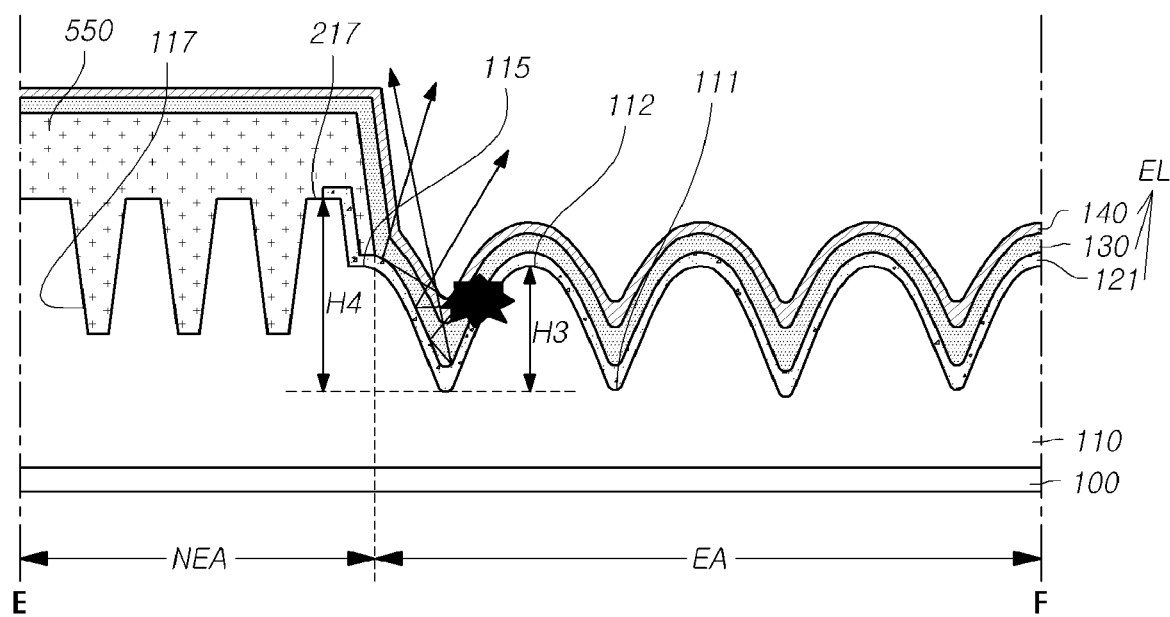
FIG. 12 is a sectional view along line E-F of the organic light emitting diode display device illustrated in FIG. 11.

This configuration will be described below in detail with reference to FIG. 12. FIG. 12 is a sectional view taken along line E-F of FIG. 11. Referring to FIG. 12, the organic light emitting element EL that includes the first electrode 121, the organic light emitting layer 130, and the second electrode 140 is disposed in the emissive area EA in the organic light emitting diode display device according to the third embodiment.

Herein, the first electrode 121 may extend to a part of the non-emissive area NEA adjacent to the emissive area EA. Specifically, an overcoat layer 110 has at least one step 115 in the non-emissive area NEA or in the emissive area EA adjacent to the non-emissive area NEA, and at least one depression 117 is disposed adjacent to the at least one step 115. Furthermore, the depression 117 located adjacent to the step 115 is connected to a protruding portion 217. In other words, the overcoat layer 110 includes the depression 117 located adjacent to the step 115 and at least one protruding portion 217 provided between the depression 117 and the step 115.

The first electrode 121 of the organic light emitting element EL may be disposed on the step 115 of the overcoat layer 110 in the non-emissive area NEA, and may further extend to a part of the protruding portion 217 of the overcoat layer 110, which is located behind the start point of the depression 117 disposed adjacent to the step 115.

In this case, the first electrode 121 may be a reflective electrode. Accordingly, a part of light emitted from the organic light emitting layer 130 is output toward a second substrate (not illustrated), and a part of the light is output toward a first substrate 100. However, the light output toward the first substrate 100 may be reflected by the first electrode 121, which is a reflective electrode, to travel toward the second substrate (not illustrated) and may be extracted from the second substrate.

Furthermore, the light emitted from the organic light emitting layer 130 may be output toward the non-emissive area NEA having no micro lenses. In this case, the light output toward the non-emissive area NEA may be reflected by the first electrode 121, which is a reflective electrode, and may be extracted toward the second substrate (not illustrated), as illustrated in FIG. 12.

Specifically, since the first electrode 121 extends to a part of the protruding portion 217 of the overcoat layer 110 in the non-emissive area NEA, which is located behind the start point of the depression 117 disposed adjacent to the step 115, the light output toward the non-emissive area NEA having no micro lenses may be extracted toward the second substrate (not illustrated) with an optical path changed by the first electrode 121.

While the first electrode 121 is illustrated in FIG. 12 as extending to a part of the protruding portion 217 of the overcoat layer 110 in the non-emissive area NEA, which is located behind the start point of the depression 117 disposed adjacent to the step 115, the first electrode 121 may further extend to a part of the depression 117.

In addition, the height H3 from concave portions 111 to connection portions 112 of micro lenses, according to this embodiment, may be less than the height H4 from the concave portions 111 of the micro lenses to the protruding portion 217 of the overcoat layer 110. Due to this, the position of the first electrode 121 disposed on the protruding portion 217 of the overcoat layer 110 may be higher than that of the first electrode 121 disposed on the connecting portions 112 of the micro lenses.

Figure 13:
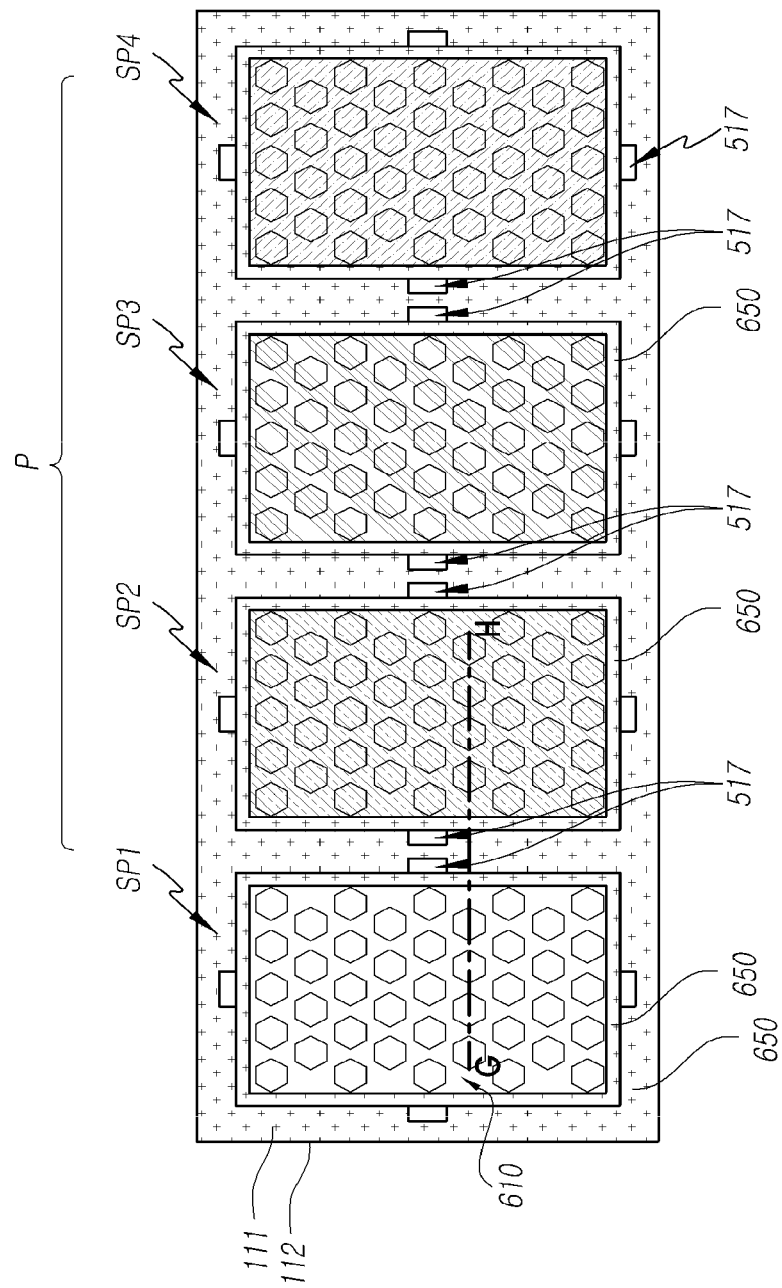
FIG. 13 is a plan view of an organic light emitting diode display device according to a fourth embodiment of the present disclosure.

Although the micro lenses of this embodiment may have a sectional shape illustrated in FIG. 13, this embodiment is not limited thereto, and the micro lenses may have a sectional shape similar to those of the micro lenses in the aforementioned embodiments.

Specifically, the position of the first electrode 121 disposed on the protruding portion 217 of the overcoat layer 110 may be higher than that of the organic light emitting element EL disposed on the connecting portions 212 of the micro lenses provided in the emissive area EA. This may help to effectively extract, from the display panel, light output toward the non-emissive area NEA among the light emitted from the organic light emitting element EL.

For example, assuming that the first electrode 121 extends only to the step 115 of the non-emissive area NEA, light extraction efficiency may be lower than that of the display device according to this embodiment since light output toward the protruding portion 127 of the overcoat layer 110 among the light emitted from the organic light emitting element EL is reflected by the first electrode 121 so that it cannot be extracted from the display panel.

Namely, since the height H3 from the concave portions 111 to the connecting portions 112 of the micro lenses is less than the height H4 from the concave portions 111 of the micro lenses to the protruding portion 217 of the overcoat layer 110, the light extraction efficiency of the organic light emitting diode display device may be enhanced. In other words, since the position of the first electrode 121 disposed on the protruding portion 217 of the overcoat layer 110 may be higher than that of the organic light emitting element EL disposed on the connecting portions 112 of the micro lenses provided in the emissive area EA, the light extraction efficiency may be enhanced.

While the first electrode 121 is illustrated as a reflective electrode in FIGS. 11 and 12, the first electrode 121 may be formed of a transparent conductive material, and a reflective layer may be additionally provided between the first electrode 121 and the overcoat layer 110 without being limited thereto. In this case, the reflective layer may be disposed in the same form as that of the first electrode 121 to enhance the light extraction efficiency of the organic light emitting diode display device.

Figure 14:
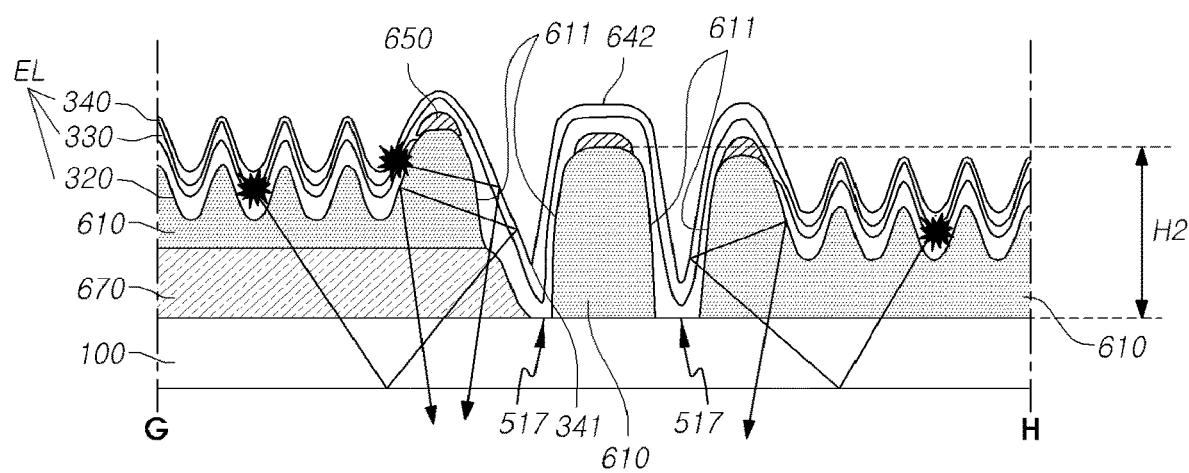
FIG. 14 is a sectional view along line G-H of the organic light emitting diode display device illustrated in FIG. 13.

Next, an organic light emitting diode display device, according to a fourth embodiment of the present invention, will be described below with reference to FIGS. 13 and 14. The organic light emitting diode display device, according to the fourth embodiment of the present invention, may include the same elements as those of the organic light emitting diode display devices in the aforementioned embodiments. Repetitive descriptions identical to ones given in the aforementioned embodiments will be omitted. Also, identical elements are provided with identical reference numerals.

FIG. 13 is a plan view of the organic light emitting diode display device according to the fourth embodiment of the present invention. Referring to FIG. 13, one pixel P may include four sub-pixels SP1, SP2, SP3, and SP4 in the organic light emitting diode display device according to the fourth embodiment of the present invention. In the organic light emitting diode display device, according to the fourth embodiment, emissive areas EA and a non-emissive area NEA may be distinguished from each other by bank patterns 650 and a first electrode of an organic light emitting element.

Specifically, the organic light emitting element, which includes the first electrode, an organic light emitting layer, and a second electrode, may be disposed in the emissive areas EA. The organic light emitting layer and the second electrode of the organic light emitting element may extend to the non-emissive area NEA from the emissive areas EA. Further, the non-emissive area NEA may include regions where the bank patterns 650 are disposed and a region where the hank patterns 650 are not disposed.

Meanwhile, since the first electrode of the organic light emitting element is not disposed in the region of the non-emissive area NEA where the bank patterns 650 are not disposed, the organic light emitting element may not emit light. An overcoat layer may also not be disposed in the region of the non-emissive area NEA where the bank patterns 650 are not disposed. In other words, the overcoat layer may have depressions 517 or recesses in a part of the non-emissive area NEA. Further, the bank patterns 650 may not be disposed in the areas that correspond to the depressions 517 or recesses of the overcoat layer.

This configuration will be described below in detail with reference to FIG. 14. FIG. 14 is a sectional view taken along line G-H of FIG. 13. Referring to FIG. 14, the organic light emitting diode display device, according to the fourth embodiment, may include a color filter layer 670 disposed on a substrate 100 that is divided into emissive areas EA and a non-emissive area NEA. While a sub-pixel having the color filter layer 670 disposed therein and a sub-pixel having no color filter layer 670 are both illustrated in FIG. 14, the organic light emitting diode display device, according to this embodiment, includes a configuration in which all sub-pixels have no color filter layer 670 and a configuration in which all sub-pixels have the color filter layers 670 disposed therein.

An overcoat layer 610 is disposed on the color filter layer 670 and the substrate 100. The overcoat layer 610 may be provided with multiple micro lenses in an area thereof that corresponds to each emissive area EA, and each micro lens includes multiple concave portions and multiple convex portions. Further, the overcoat layer 610 may include one or more depressions 517 in the area corresponding to the non-emissive area NEA.

Moreover, the organic light emitting element EL, which includes the first electrode 320, the organic light emitting layer 330, and the second electrode 340, is disposed on the overcoat layer 610 to correspond to the emissive areas EA. Herein, the first electrode 320 may be formed of a transparent conductive material, and the second electrode 340 may be formed of a reflective material. Since the first electrode 320 is formed of a transparent conductive material and the second electrode 340 is formed of a reflective material, the organic light emitting diode display device, according to the fourth embodiment, may implement a bottom-emission type organic light emitting diode display device.

In addition, the bank patterns 650 may be only disposed on the overcoat layer 610 corresponding to the non-emissive area NEA. In other words, the bank patterns 650 may not be disposed in the regions of the non-emissive area NEA that correspond to the depressions 517 of the overcoat layer 610. In this case, the bank patterns 650 may be disposed such that the side surfaces of the overcoat layer 610 are exposed in the areas corresponding to the depressions 517 of the overcoat layer 610.

The bank patterns 650 may be formed of a transparent organic material or an opaque organic material. Namely, a material capable of distinguishing between the emissive areas EA and the non-emissive area NEA will suffice for the bank patterns 650 of the organic light emitting diode display device according to the fourth embodiment.

Furthermore, the organic light emitting layer 330 and the second electrode 340 of the organic light emitting element EL may extend to the non-emissive area NEA. In this case, the organic light emitting layer 330 and the second electrode 340 may be disposed on the bank patterns 650 in the non-emissive area NEA adjacent to the emissive areas EA.

The organic light emitting layer 330 and the second electrode 340 may be disposed on the depressions 517 of the overcoat layer 610. Namely, the organic light emitting layer 330 and the second electrode 340 may also be disposed on the side surfaces of the overcoat layer 610 that are exposed by means of the bank patterns 650 in the areas corresponding to the depressions 517 of the overcoat layer 610.

In other words, since the overcoat layer 610 has the one or more depressions 517 in the non-emissive area NEA, one or more surfaces thereof may be inclined surfaces 611. Accordingly, the organic light emitting layer 330 and the second electrode 340 may have inclined surfaces corresponding to the inclined surfaces 611 of the overcoat layer 610 in the non-emissive area NEA.

Namely, the second electrode 340, which is a reflective electrode, may have concave portions 341 and a convex portion 642 on account of the depressions 517 provided in the overcoat layer 610. In this case, the concave portions 341 of the second electrode 340 may be provided to correspond to the depressions 517 of the overcoat layer 610.

When the overcoat layer 610 has multiple depressions 517 in the non-emissive area NEA, the second electrode 340 may have multiple concave portions 341 and multiple convex portions 642 in the non-emissive area NEA. That is, the second electrode 340, which is a reflective electrode, may have an out-coupling structure in the non-emissive area NEA.

While a part of light emitted from the organic light emitting element EL disposed in the emissive area EA may be extracted from the substrate 100, a part of the light that is not extracted from the substrate 100 is confined within the display device due to total reflection caused by a difference in refractivity between the substrate 100 and air.

Specifically, among the light emitted from the organic light emitting element EL disposed in the emissive area EA, light incident to the substrate 100 with an incidence angle larger than or equal to a total-reflection critical angle (for example, 60□) is confined within the substrate 100 without being extracted from the substrate 100 due to total reflection at the boundary between the substrate 100 and air, which is caused by a difference in refractivity between the substrate 100 and air outside the substrate 100. Namely, the light incident to the substrate 100 with an incidence angle larger than or equal to the total-reflection critical angle is lost without being extracted from the substrate 100.

However, since the organic light emitting diode display device, according to this embodiment, has an out-coupling structure in which the second electrode 340, which is a reflective electrode, has the multiple concave portions 341 and the multiple convex portions 642 in the non-emissive area NEA, light extraction efficiency may be enhanced.

Specifically, since the overcoat layer 610 has the depressions 517 in the non-emissive area NEA, the second electrode 340 may have an out-coupling structure in which the second electrode 340 has the multiple concave portions 341 and the multiple convex portions 642 in the non-emissive area NEA. Meanwhile, among the light emitted from the organic light emitting element EL disposed in the emissive area EA, light incident to the substrate 100 with an incidence angle larger than or equal to the total-reflection critical angle may be totally reflected at the interface between the substrate 100 and air to reach the inclined surface of the second electrode 340 in the non-emissive area NEA (herein, the optical path does not vary much since the organic light emitting layer 330 has a refractive index that is almost the same as that of the second electrode 340). The light that reaches the inclined surface of the second electrode 340 in the non-emissive area NEA may be reflected by the second electrode 340, which is a reflective electrode, and may be input to the substrate 100 with an incident angle smaller than or equal to the total-reflection critical angle so as to be extracted from the substrate 100.

Meanwhile, the height of the depressions 517 provided in the overcoat layer 610 may be the same as the vertical length of the overcoat layer 610 in the non-emissive area NEA. Namely, the depressions 517 may be disposed to expose the surface of the substrate 100 as illustrated in FIG. 14. However, this embodiment is not limited thereto, and in a case where other insulation layers are disposed between the substrate 100 and the overcoat layer 610, the depressions 517 of the overcoat layer 610 may be disposed to expose the surface of an insulation layer adjacent to the overcoat layer 610.

Since the height of the depressions 517 of the overcoat layer 610 is the same as the vertical length of the overcoat layer 610 provided in the non-emissive area NEA, the surface areas of the inclined surfaces 611 of the overcoat layer 610, which are provided by the depressions 517, become large. Accordingly, the surface area of the second electrode 340, which is disposed on the inclined surfaces 611 of the overcoat layer 610, also becomes large so that it is possible to effectively reflect light travelling toward another emissive area EA that is adjacent to light totally reflected at the interface between the substrate 100 and air.

In other words, when the second electrode 340 has a large surface area, the area by which the light totally reflected at the interface between the substrate 100 and air may reach the second electrode becomes larger, and the area by which the light travelling toward the adjacent emissive area EA may reach the second electrode 340 becomes larger than when the second electrode 340 has a small surface area, which makes it possible to extract a larger amount of light from the substrate 100.

As described above, the organic light emitting diode display device, according to this embodiment, reflects light incident to the substrate 100 with an incidence angle larger than or equal to the total-reflection critical angle among the light emitted from the organic light emitting element EL by using the second electrode 340 having the inclined surfaces disposed in the non-emissive area NEA to extract the reflected light from the substrate 100, thereby enhancing the light-emitting efficiency of the organic light emitting diode display device.

In addition, among light emitted from the organic light emitting element EL outside an emissive area EA, light output toward another adjacent emissive area EA is reflected by means of the second electrode 340 having inclined surfaces disposed between the different emissive areas EA and is extracted from the substrate 100. Accordingly, it is possible to prevent a light leakage phenomenon between sub-pixels, which is caused by light travelling toward the adjacent emissive area EA.

Figure 15:
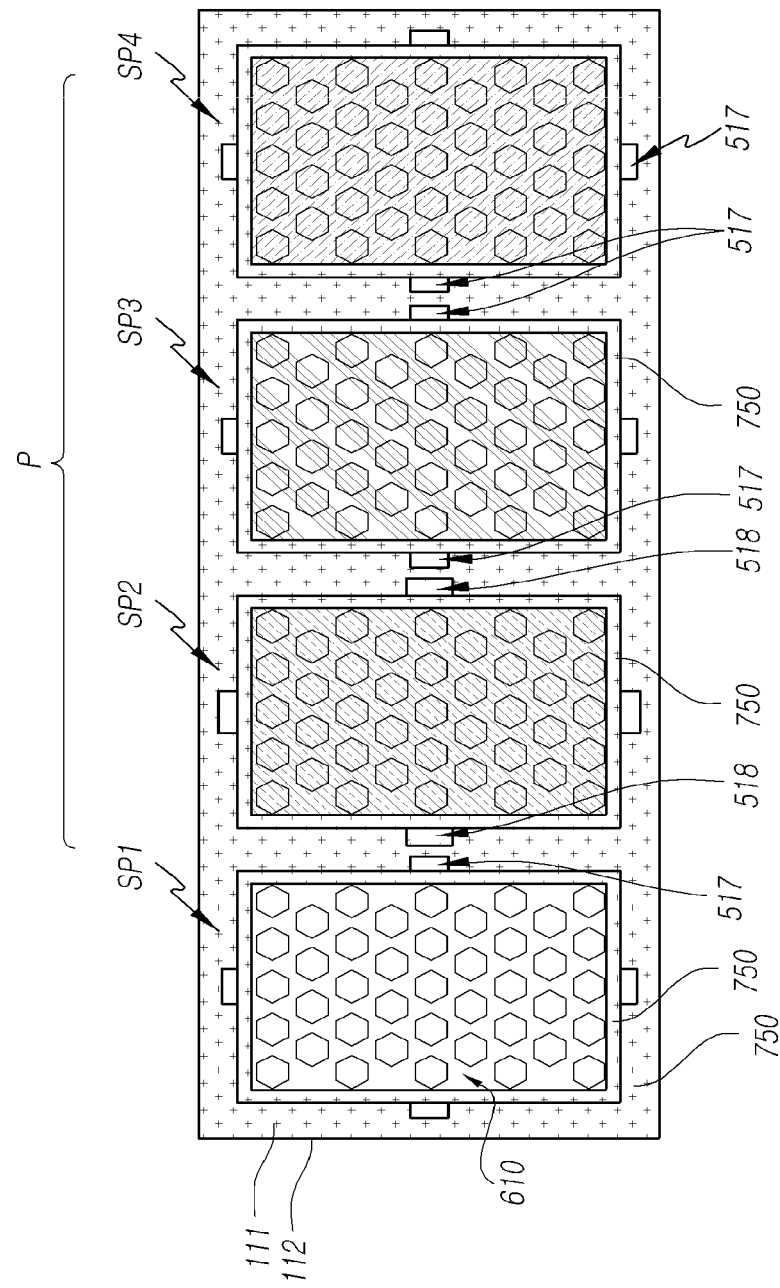
FIG. 15 is a plan view of an organic light emitting diode display device according to a fifth embodiment of the present disclosure.

While the depressions 517 of the overcoat layer that are provided adjacent to the individual emissive areas EA have the same size in the organic light emitting diode display device, according to the fourth embodiment (see FIG. 13), the present invention is not limited thereto, and depressions may have different sizes as illustrated in FIG. 15. This configuration will be described below in detail with reference to FIG. 15.

FIG. 15 is a plan view of an organic light emitting diode display device according to a fifth embodiment of the present invention. The organic light emitting diode display device, according to the fifth embodiment of the present invention, may include the same elements as those of the organic light emitting diode display devices in the aforementioned embodiments. Repetitive descriptions identical to ones given in the aforementioned embodiments will be omitted. Also, identical elements are provided with identical reference numerals.

Referring to FIG. 15, the organic light emitting diode display device, according to the fifth embodiment, may include an overcoat layer that has multiple depressions 517 and 518 in a part of a non-emissive area NEA. In this case, the multiple depressions 517 and 518 provided in the non-emissive area NEA may have different sizes.

For example, a first depression 518 disposed adjacent to one emissive area may be larger in size than a second depression 517 disposed adjacent to another emissive area. For example, the first depression 518 may be wider than the second depression 517. This may help to enhance the light extraction efficiency of an emissive area that has lower light extraction efficiency than other emissive areas.

While the first depression 518 and the second depression 517 are illustrated in FIG. 15 as corresponding to partial areas outside emissive areas, this embodiment is not limited thereto, and the first depression 518 or the second depression 517 may be provided to surround the emissive areas.

Figure 16:
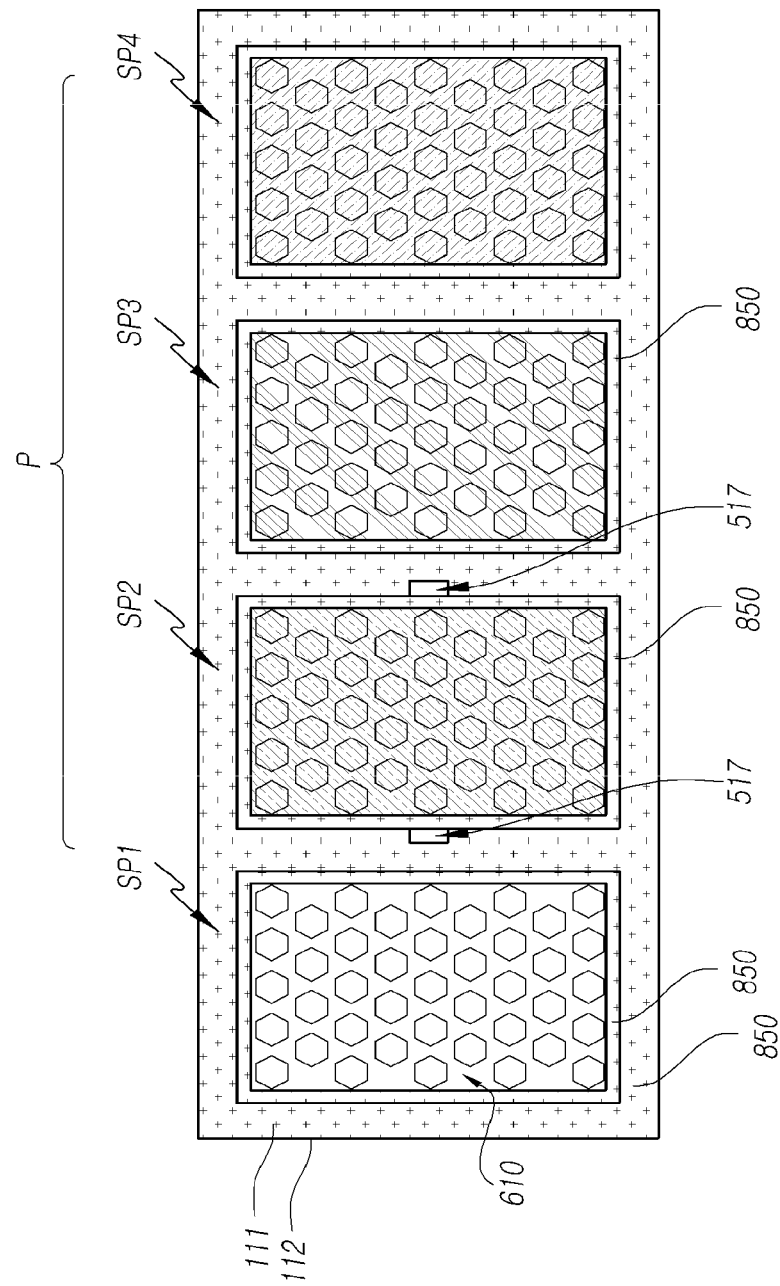
FIG. 16 is a plan view of an organic light emitting diode display device according to a sixth embodiment of the present disclosure.

Next, an organic light emitting diode display device, according to a sixth embodiment of the present invention, will be described below with reference to FIG. 16. FIG. 16 is a plan view of the organic light emitting diode display device according to the sixth embodiment of the present invention. The organic light emitting diode display device, according to the sixth embodiment, may include the same elements as those of the organic light emitting diode display devices in the aforementioned embodiments. Repetitive descriptions identical to ones given in the aforementioned embodiments will be omitted. Also, identical elements are provided with identical reference numerals.

Referring to FIG. 16, in the organic light emitting diode display device, according to the sixth embodiment, depressions 517 of an overcoat layer may be provided only in areas that correspond to the outer periphery of a particular emissive area in one pixel P. Specifically, in the organic light emitting diode display device, according to the sixth embodiment, the depressions 517 of the overcoat layer may be provided only in areas that correspond to the outer periphery of a particular area of a plurality of emissive areas provided in one pixel P and may not be provided in areas that correspond to the outer peripheries of the remaining emissive areas.

This may help to enhance the light extraction efficiency of a desired emissive area. Namely, the organic light emitting diode display device, according to the sixth embodiment, may adjust light extraction efficiency in units of emissive areas through the depressions 517 of the overcoat layer.

Next, one pixel of an organic light emitting diode display device to which a sub-pixel, according to an embodiment of the present invention, is applied will be hereinafter described. FIG. 17 is a sectional view of the pixel of the organic light emitting diode display device to which the sub-pixel, according to the embodiment of the present invention, is applied.

The organic light emitting diode display device of FIG. 17 may include the same elements as those of the organic light emitting diode display devices in the aforementioned embodiments. Repetitive descriptions identical to ones given in the aforementioned embodiments will be omitted. Also, identical elements are provided with identical reference numerals.

Referring to FIG. 17, one pixel P of the organic light emitting diode display device, to which the sub-pixel according to the present invention is applied, includes four sub-pixels. While the pixel P is illustrated in FIG. 17 as including four sub-pixels, the present invention is not limited thereto, and the pixel P may include two or three sub-pixels.

In FIG. 17, the pixel P may include four sub-pixels, and each sub-pixel may include one emissive area EA and one non-emissive area NEA. Herein, multiple micro lenses are arranged in each emissive area EA on an overcoat layer 110, and multiple depressions 117 are arranged in each non-emissive area NEA on the overcoat layer 110. Further, a first electrode 120 of an organic light emitting element EL is disposed on a first substrate 100 on which the multiple micro lenses and the multiple depressions 117 are arranged.

In this case, the first electrode 120 may be disposed in the emissive area EA and in a part of the non-emissive area NEA. Although the first electrode 120 is illustrated in FIG. 13 as being disposed within the multiple depressions 117, the arrangement of the first electrode 120 of the organic light emitting diode display device, according to the present invention, is not limited thereto, and the first electrode 120 may be disposed within only some of the multiple depressions 117, or may be disposed only in the emissive areas EA.

A bank pattern 150 is disposed to fill the multiple depressions 117. In this case, the bank pattern 150 may be formed of an opaque organic material. When light emitted from the organic light emitting element EL travels toward an adjacent sub-pixel, the bank pattern 150 may serve to absorb the light in order to prevent the light from reaching the different adjacent sub-pixel.

Meanwhile, this embodiment is not limited thereto, and the bank pattern 150 may have a shape that corresponds to the morphology of the multiple depressions 117. In this case, although not illustrated in the drawing, the first electrode 120 of the organic light emitting element EL may also be configured to correspond to the morphology of the multiple depressions 117. Furthermore, the first electrode 120 may be provided so as to be superposed on all the multiple depressions 117, but not some of the multiple depressions 117. However, the first electrode 120 may not be provided at the boundary between the sub-pixels.

As described above, in the organic light emitting diode display devices, according to the embodiments of the present invention, the overcoat layer in the non-emissive area NEA has at least one depression, and the bank pattern is provided so as to be superposed on the depression, which makes it possible to prevent light emitted from the organic light emitting element from travelling toward a sub-pixel emitting light having a different color to cause a light leakage phenomenon.

In addition, in the organic light emitting diode display devices, according to the embodiments of the present invention, the overcoat layer in the non-emissive area NEA has at least one depression, and the reflective electrode is disposed along the shape of the depression, which makes it possible to absorb light travelling toward a sub-pixel that emits light having a different color, among light emitted from an organic light emitting element, thereby preventing light leakage, or to reflect the light travelling toward the sub-pixel, thereby enhancing light extraction efficiency.

Particular characteristics, structures, or effects described in connection with the embodiments are included in at least one embodiment of the present invention and not necessarily in all embodiments. Furthermore, the particular characteristics, structures, or effects of any specific embodiment of the present invention may be combined in any suitable manner with one or more other embodiments or may be changed by those skilled in the art to which the embodiments pertain. Therefore, it is to be understood that contents associated with such combination or change fall within the spirit and scope of the present invention.

Although the present invention has been described with reference to some exemplary embodiments, it should be understood that these embodiments are given by way of illustration only and do not limit the scope of the invention, and that various modifications, variations, and alterations can be made by those skilled in the art without departing from the spirit and scope of the invention. For example, the components specifically shown in the embodiments can be modified.

What is claimed is:

1. An organic light emitting diode display device comprising:
    a substrate having a plurality of emissive areas and a non-emissive area that surrounds the plurality of emissive areas;
    an overcoat layer disposed on the substrate and having a plurality of micro lenses in each emissive area and at least one depression in the non-emissive area, the plurality of micro lenses comprising a concave portion;
    a first electrode disposed on the overcoat layer in the plurality of emissive areas;
    an organic light emitting layer disposed on the first electrode, the overcoat layer, and the at least one depression; and
    a second electrode disposed on the organic light emitting layer and including at least one concave portion disposed on the at least one depression,
    wherein a distance between the substrate and the concave portion of the second electrode is smaller than a distance between the substrate and the concave portion of the plurality of micro lenses,
    wherein the overcoat layer is configured to have a single layer,
    wherein the organic light emitting layer covers the at least one depression and is in contact with one side of the overcoat layer in the at least one depression, and
    wherein the at least one depression does not overlap with the first electrode.

2. The organic light emitting diode display device of claim 1, wherein a height of the at least one depression is the same as a vertical length of the overcoat layer in the non-emissive area.

3. The organic light emitting diode display device of claim 1, wherein the second electrode further comprises at least one convex portion in the non-emissive area.

4. The organic light emitting diode display device of claim 3, wherein a bottom surface of the at least one concave portion of the second electrode is positioned between the substrate and the concave portion of the plurality of micro lenses.

5. The organic light emitting diode display device of claim 1, wherein the at least one depression is provided in the non-emissive area corresponding to at least one side of at least one of the plurality of emissive areas.

6. The organic light emitting diode display device of claim 1, wherein a first depression provided in an area corresponding to one side of at least one of the plurality of emissive areas has a different size from that of a second depression provided in an area corresponding to one side of each of the remaining plurality of emissive areas.

7. The organic light emitting diode display device of claim 1, wherein the second electrode is a reflective electrode.

8. The organic light emitting diode display device of claim 1, wherein the at least one depression has a different shape from a shape of the concave portion.

9. The organic light emitting diode display device of claim 1, wherein the at least one depression surrounds the emissive area in a plan view.

10. The organic light emitting diode display device of claim 1, wherein the overcoat layer has inclined surfaces in the at least one depression, and
wherein the organic light emitting layer and the second electrode have inclined surfaces corresponding to the inclined surfaces of the overcoat layer in the at least one depression.

11. The organic light emitting diode display device of claim 1, further comprising a bank pattern disposed between the organic light emitting layer and the overcoat layer in the non-emissive area.

12. The organic light emitting diode display device of claim 11, wherein the bank pattern is formed of an opaque organic material.

13. The organic light emitting diode display device of claim 11, wherein the organic light emitting layer and the second electrode are disposed on side surfaces of the overcoat layer that are exposed by the bank patterns in the areas corresponding to the at least one depression of the overcoat layer.

14. The organic light emitting diode display device of claim 1, further comprising a color filter disposed between the overcoat layer and the substrate,
wherein the organic light emitting layer is in contact with one side of the color filter in the at least one depression.

15. The organic light emitting diode display device of claim 1, wherein the organic light emitting layer is in contact with an upper surface of the overcoat layer to cover an end portion of the first electrode.

16. The organic light emitting diode display device of claim 1, wherein the second electrode includes at least one concave portion disposed on the at least one depression, and
wherein the at least one concave portion of the second electrode is positioned between the substrate and the concave portion of the plurality of micro lenses.

17. An organic light emitting diode display device comprising:
a substrate divided into an emissive area and a non-emissive area;
an overcoat layer disposed on the substrate and having a plurality of micro lenses in the emissive area and at least one depression in the non-emissive area, the plurality of micro lenses comprising a concave portion;
a first electrode disposed on the overcoat layer in the emissive area;
an organic light emitting layer disposed on the first electrode, the overcoat layer, and the at least one depression; and
a second electrode disposed on the organic light emitting layer and including at least one concave portion disposed on the at least one depression,
wherein the at least one depression has a different shape from a shape of the concave portion,
wherein a distance between the substrate and the concave portion of the second electrode is smaller than a distance between the substrate and the concave portion of the plurality of micro lenses,
wherein the overcoat layer is configured to have a single layer,
wherein the organic light emitting layer covers the at least one depression and is in contact with one side of the overcoat layer in the at least one depression, and
wherein the at least one depression does not overlap with the first electrode.

18. The organic light emitting diode display device of claim 17, further comprising a thin film transistor disposed in the non-emissive area and covered by the overcoat layer,
wherein the first electrode disposed is connected to the thin film transistor through a contact hole formed in the overcoat layer, and
wherein the at least one depression has a different shape from a shape of the concave portion and the contact hole.

19. The organic light emitting diode display device of claim 17, wherein the second electrode further comprises at least one convex portion in the non-emissive area, and
wherein a bottom surface of the at least one concave portion of the second electrode is positioned between the substrate and the concave portion of the plurality of micro lenses.

20. The organic light emitting diode display device of claim 17, wherein the at least one depression is provided in the non-emissive area corresponding to at least one side of the emissive area.

21. The organic light emitting diode display device of claim 17, wherein a first depression provided in an area corresponding to one side of at least one of the plurality of emissive areas has a different size from that of a second depression provided in an area corresponding to one side of each of the remaining plurality of emissive areas.

22. The organic light emitting diode display device of claim 17, wherein the second electrode is a reflective electrode.

23. The organic light emitting diode display device of claim 17, wherein the at least one depression surrounds the emissive area in a plan view.

24. The organic light emitting diode of claim 17, wherein the organic light emitting layer is in contact with an upper surface of the overcoat layer to cover an end portion of the first electrode.

25. The organic light emitting diode display device of claim 17, wherein the second electrode includes at least one concave portion disposed on the at least one depression, and
wherein the at least one concave portion of the second electrode is positioned between the substrate and the concave portion of the plurality of micro lenses.

* * * * *